(12) United States Patent
Nishi

(10) Patent No.: US 6,741,332 B2
(45) Date of Patent: May 25, 2004

(54) STAGE SYSTEM, EXPOSURE APPARATUS, AND DEVICE MANUFACTURING METHOD

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/407,254

(22) Filed: Apr. 7, 2003

(65) Prior Publication Data

US 2003/0169409 A1 Sep. 11, 2003

Related U.S. Application Data

(63) Continuation of application No. PCT/JP02/07680, filed on Jul. 29, 2002.

(30) Foreign Application Priority Data

Aug. 8, 2001 (JP) ........................................ 2001-241354

(51) Int. Cl.$^7$ ......................... G03B 27/58; G03B 27/42; G03B 27/62; H02K 41/00; B64C 17/06

(52) U.S. Cl. ............................. 355/72; 355/53; 355/75; 310/12; 318/649

(58) Field of Search ............................. 355/72, 53, 75; 318/649; 250/492.2; 310/10, 12; 29/25.01; 414/222.02

(56) References Cited

U.S. PATENT DOCUMENTS 6,157,159 A 12/2000 Korenaga et al.

FOREIGN PATENT DOCUMENTS

| JP | 11-217112 | 8/1999 |
|---|---|---|
| JP | 2000-29530 | 1/2000 |
| JP | 2000-29533 | 1/2000 |
| JP | 2000-161425 | 6/2000 |
| JP | 2000-357655 | 12/2000 |
| JP | 2001-110699 | 4/2001 |
| JP | 2001-223159 | 8/2001 |
| WO | WO 01/27978 | 4/2001 |

OTHER PUBLICATIONS

Pub. No. US 2001/0004105 A1, Appl. No. 09/739,106, Filed: Dec. 19, 2000, Inventor: Y. B. P. Kwan, et al.

Pub. No. US 2001/0027595 A1, Appl. No. 09/824,061, Filed: Apr. 3, 2001, Inventor: K. Saiki.

*Primary Examiner*—Peter B. Kim
(74) *Attorney, Agent, or Firm*—Oblon, Spivak, McClelland, Maier & Neustadt, P.C.

(57) ABSTRACT

A stage is driven along guide surfaces of a supporting member with a stator that is provided independent from the support member vibration-wise and a mover connected to the stage. In addition, when a drive amount of the supporting member exceeds a predetermined amount in, for example, the vertical direction, a connection between the stage and the mover by a connection mechanism is released. That is, the connection between the stage and the mover is released before the mover connected to the stage on the supporting member comes into contact with the stator and both parts are put under a large stress, which can prevent the mover and stator from being damaged. Furthermore, since the stator is provided independent from the support member vibration-wise, position control of the stage can be preformed with high precision. Accordingly, the stage can be driven stably, for over a long period of time.

24 Claims, 14 Drawing Sheets

STAGE SYSTEM, EXPOSURE APPARATUS, AND DEVICE MANUFACTURING METHOD

CROSS-REFERENCE TO RELATED APPLICATIONS

This is a continuation of International Application PCT/JP02/07680, with an international filing date of Jul. 29, 2002, the entire content of which being hereby incorporated herein by reference, which was not published in English.

BACKGROUND OF THE INVENTION

1. Field of the Invention

The present invention relates to stage systems, exposure apparatus, and device manufacturing methods, and more particularly to a stage system comprising a stage main body that moves along a movement plane of a supporting member, a mover that is connected to the stage main body, and a stator that is provided independent of the supporting member of vibration, an exposure apparatus that comprises the stage system as a drive system for at least one of a mask and a substrate, and a device manufacturing method that uses the exposure apparatus when exposure is performed.

2. Description of the Related Art

In a conventional photolithographic process for manufacturing devices such as semiconductors and liquid crystal display devices, projection exposure apparatus of a sequential moving type such as a reduction projection exposure apparatus based on a step-and-repeat method (a so-called stepper) that reduces and transfers a pattern formed on a mask or a reticle (hereinafter generally referred to as a "reticle") onto a substrate such as a wafer or a glass plate (hereinafter generally referred to as a "wafer") coated with a resist or the like via a projection optical system, and a scanning projection exposure apparatus based on a step-and-scan method (a so-called scanning stepper), which is an improvement of the stepper, are being widely used.

For example, in a scanning stepper, a reticle stage supporting member is a movement reference of a reticle stage on which a reticle is held. And, since it plays an important part when setting an imaging plane on which an image of a pattern formed on the reticle is formed by a projection optical system, vibration of the reticle supporting member is preferably suppressed as much as possible, even when the reticle stage is being driven.

In addition, with a wafer stage of a projection exposure apparatus, in most cases a wafer table that can be driven at least in a Z tilt is arranged on an XY stage that can be driven in an XY plane in order to make the wafer surface coincide with the image plane on which the image of the pattern on the reticle is formed, and the wafer is held on the wafer table. In such cases, when vibration occurs in a wafer stage supporting member that exceeds a predetermined amount, the vibration cannot be attenuated sufficiently, which causes the control accuracy of the position of the wafer table in the Z-axis direction to decrease.

Therefore, when the reticle stage or the wafer stage is driven, such as by a linear motor, in order to keep a reaction force that occurs when the stage is driven by the linear motor from traveling to the stage supporting member, the stator of the linear motor on which the reaction force due to the drive of the stage acts is to be separated from the stage supporting member, or a so-called counter mass mechanism where the stator moves for conservation of momentum by the action of the reaction force is to be employed. With the above arrangement, the stage supporting member is isolated from vibration caused by the reaction force that occurs when the stage is driven.

In addition, in order to prevent the stage supporting member from vibrating due to vibration from the floor, dampers are preferably arranged in between the stage supporting member and the floor so as to isolate vibration with respect to the stage supporting member.

In both the reticle stage and the wafer stage, a linear motor is used in many cases as a means for driving in at least a long stroke direction (normally a direction along one axis within a horizontal plane). With such a linear motor, permissible relative displacement in between the mover and the stator in a direction perpendicular to the horizontal surface (a height direction) is small, such as around the range of ±0.5 mm, which is the limit for obtaining effective thrust.

Meanwhile, as the damper referred to above, in order to obtain a sufficient vibration attenuation effect, an AVIS (a vibration isolator the performs vibration attenuation by a combination of a mechanical damper that can bear heavy weight such as an air damper and an electromagnetic actuator such as a voice coil motor) is frequently employed. That is, the AVIS proactively drives the stage supporting member, so as to prevent the vibration in the stage bed caused by the vibration from the floor. With the AVIS, however, the permissible movable stroke from a neutral position to a position where a stopper (mechanical stopper) that mechanically limits its drive is arranged is around ±3 mm. Therefore, when the AVIS goes out of control, since the drive strokes of the stage supporting member by the AVIS exceeds the above permissible range of the linear motor the linear motor may consequently be damaged due to the stator and the mover of the linear motor coming into contact with each other.

As a method of preventing such a situation, for example, guide portions of the stator and the mover of the linear motor may each be arranged separately from a guide surface on the stage supporting member. With such an arrangement, however, since the guide surface of each of the stages is originally arranged on the stage supporting member, it becomes difficult to maintain a suitable positional relationship between the guide surfaces of the stages and the guide portions of the stator and mover of the linear motor. And, as a consequence, the guide portions of the stator and the mover of the linear motor could be damaged.

Therefore, in the conventional art, maintenance had to be frequently preformed on the linear motor or on its guide portion. This, however, leads to an increase in the downtime of the exposure apparatus, which in turn, becomes a cause of decreasing the productivity of a device as an end product.

SUMMARY OF THE INVENTION

The present invention was made under such circumstances, and has as its first object to provide a stage system that can stably drive a stage main body for a long period of time.

In addition, the second object of the present invention is to provide an exposure apparatus that can improve operation efficiency.

Moreover, the third object of the present invention is to provide a device manufacturing method that can improve productivity of a device.

According to the first aspect of the present invention, there is provided a stage system comprising: a stage main body that is movable along a movement plane of a supporting member; a mover that is coupled with the stage main body; a stator that cooperates with the mover to move the stage main body, the stator being provided independent of the supporting member regarding vibration; a driver that drives the supporting member; and a releaser that releases a coupling between the stage main body and the mover when a drive amount of the supporting member by the driver exceeds a predetermined amount.

With the stage system, the stage main body is driven along the movement plane of the supporting member, with the stator provided independent of the supporting member regarding vibration cooperating with the mover coupled with the stage main body. The driver drives the supporting member, however, when the drive amount of the driver exceeds a predetermined value, the coupling between the stage main body and the mover is released. That is, when the drive amount of the supporting member exceeds a predetermined value, the releaser releases the coupling between the stage main body and the mover before the mover coupled with the stage main body comes into contact with the stator and both parts are put under a large stress. As a consequence, the mover and stator can be kept from being damaged from the contact. In addition, since the stator is provided independent of the supporting member regarding vibration, the reaction force generated in the stator when the stage main body is driven does not make the supporting member vibrate, therefore, position control of the stage main body moving along the movement plane of the supporting member can be performed with high precision. Accordingly, with the stage system, the stage main body can be driven stably, for over a long period of time.

In this case, the direction in which the driver drives the supporting member is not limited in particular. For example, the driver can drive the supporting member in a direction substantially perpendicular to the movement plane.

With the stage system in the present invention, various methods of coupling the stage main body and the mover and configurations of a releaser can be considered. For example, the stage main body and the mover may have a magnetic coupling, and the releaser may release the magnetic coupling, or the stage main body and the mover may have a coupling by vacuum chucking force, and the releaser may release the coupling by vacuum chucking force.

With the stage system in the present invention, it can comprise a support mount that is provided independent of the supporting member regarding vibration, and the stator can be coupled with the support mount.

With the stage system in the present invention, it can comprise a support mount that is provided independent of the supporting member regarding vibration, and the stator can be movably supported by the support mount.

In this case, the stator that is supported movably by the support mount can move in a direction opposite to a drive direction of the stage main body due to a reaction force generated when the stage main body is driven.

With the stage system in the present invention, when the stator is movably supported by the support mount, the stage system can further comprise a position correction mechanism that corrects a positional change of the stator occurring when the stage main body moves.

With the stage system in the present invention, when the stator is movably supported by the support mount, an acting point of a cooperative drive force of the stator and the mover can coincide with a center of gravity of the stage main body and a center of gravity of the stator, and the releaser can release the coupling between the stage main body and the mover when a positional displacement between the movement plane of the supporting member and a movement plane of the stator on the support mount exceeds a predetermined value due to the driver driving the supporting member.

With the stage system in the present invention, the stage main body and the mover can have a coupling by suction force, and the releaser can include an on/off mechanism that stops generating the suction force when it detects the mover coming into contact with the stator due to the driver driving the supporting member.

With the stage system in the present invention, it can further comprise an elastic member that has a degree of rigidity that avoids mechanical damage in the stage system when the releaser releases the coupling, and couples the stage main body and the mover.

According to the second aspect of the present invention, there is provided a first exposure apparatus that transfers a pattern formed on a mask onto a substrate, the exposure apparatus comprising: a first drive system that drives the mask; and a second drive system that drives the substrate, whereby the stage system in the present invention is used as at least one of the first drive system and the second drive system in the exposure apparatus.

In the exposure apparatus, the stage system in the present invention that stably drives the stage main body for over a long period of time is used in at least one of the first drive system, which drives the mask, and the second drive system, which drives the substrate. Therefore, at least one of the mask and the substrate can be stably driven for over a long period of time, and the overlay accuracy of the mask and the substrate can be favorably maintained. In addition, in the stage system, since the stator and the mover of the driver that drives the stage main body are not likely to be damaged by coming into contact, maintenance is not required. Accordingly, the downtime of the exposure apparatus can be reduced, and as a result the operation rate can be improved.

According to the third aspect of the present invention, there is provided a second exposure apparatus that exposes a photosensitive object with an energy beam and forms a predetermined pattern on the photosensitive object, the exposure apparatus comprising: at least one object stage movable along a first movement plane holding the photosensitive object; a first stage driver that has a first mover coupled with the object stage and a first stator driving the object stage by a driving force generated by physical interaction with the first mover; and a first releaser that releases a coupling between the object stage and the first mover when the first mover and the first stator come into contact due to relative displacement of the first movement plane with respect to the first stator.

In the exposure apparatus, the first stage driver drives the object stage coupled with the first mover by a suction force along the first movement plane, by a drive force generated by physical interaction between the first mover and the first stator (such as an electromagnetic interaction). And, when the first mover and the first stator come into contact due to relative displacement of the first movement plane with respect to the first stator for some reason, the releaser releases the coupling between the first mover and the object stage. Therefore, in the second exposure apparatus, damage in the first stator and the first mover of the first driver caused by coming into contact can be almost prevented, which reduces the maintenance frequency of the first stage driver since maintenance on the first stage driver due to the first stator coming into contact with the first mover will not be required. Accordingly, the downtime of the exposure apparatus can be reduced, and as a result the operation rate can be improved.

In this case, the object stage and the first mover can have a coupling by suction force, and the first releaser can release the coupling between the object stage and the first mover by releasing the suction force.

With the second exposure apparatus in the present invention, the first movement plane can be formed on a supporting member that is isolated from the first stator regarding vibration.

With the second exposure apparatus in the present invention, a plurality of object stages can be provided, and the first stage driver can have a plurality of first movers individually coupled by suction force with each of the object stages, and at least one of the first stator that can generate the driving force driving each of the object stages by physical interaction with each of the first movers, and the first releaser can release the suction force between at least a specific first mover and its corresponding object stage when the specific first mover comes into contact with its corresponding first stator.

In this case, the exposure apparatus can further comprise: a projection optical system that projects the energy beam emitted from a mask, which is an original plate of the pattern, on the photosensitive object; a focus detection system that detects a position of the photosensitive object held on each of the object stages in a direction of an optical axis of the projection optical system; a position measurer that measures a position of each of the object stages within a plane perpendicular to the optical axis; and an adjuster that adjusts a positional relationship between the movement plane and each of the object stages in the direction of the optical axis, based on a map regarding a position of each of the stages and a positional relationship between at least two of the object stages, measurement results of the position measurer, and detection results of the focus detection system.

With the second exposure apparatus in the present invention, it can further comprise: a mask stage that is movable along a second movement plane holding a mask, which is an original plate of the pattern; a second stage driver that has a second mover coupled with the mask stage and a second stator driving the mask stage by a driving force generated by physical interaction with the second mover; and a second releaser that releases a coupling between the mask stage and the second mover when the second mover and the second stator come into contact due to relative displacement of the second movement plane with respect to the second stator.

In this case, the mask stage and the second mover can have a coupling by suction force, and the second releaser can release the coupling between the mask stage and the second mover by releasing the suction force.

With the second exposure apparatus in the present invention, the second movement plane can be formed on a supporting member that is isolated from the second stator regarding vibration.

With the second exposure apparatus in the present invention, the suction force of the exposure apparatus can be one of a vacuum chucking force and a magnetic suction force.

In addition, in a lithographic process, by performing exposure using one of the first and second exposure apparatus in the present invention, the downtime of the exposure apparatus can be reduced, which can improve the productivity of the devices. Accordingly, in the present invention, furthermore from another aspect, there is provided a device manufacturing method using one of the first and second exposure apparatus in the present invention.

DESCRIPTION OF THE PREFERRED EMBODIMENTS

Figure 1:
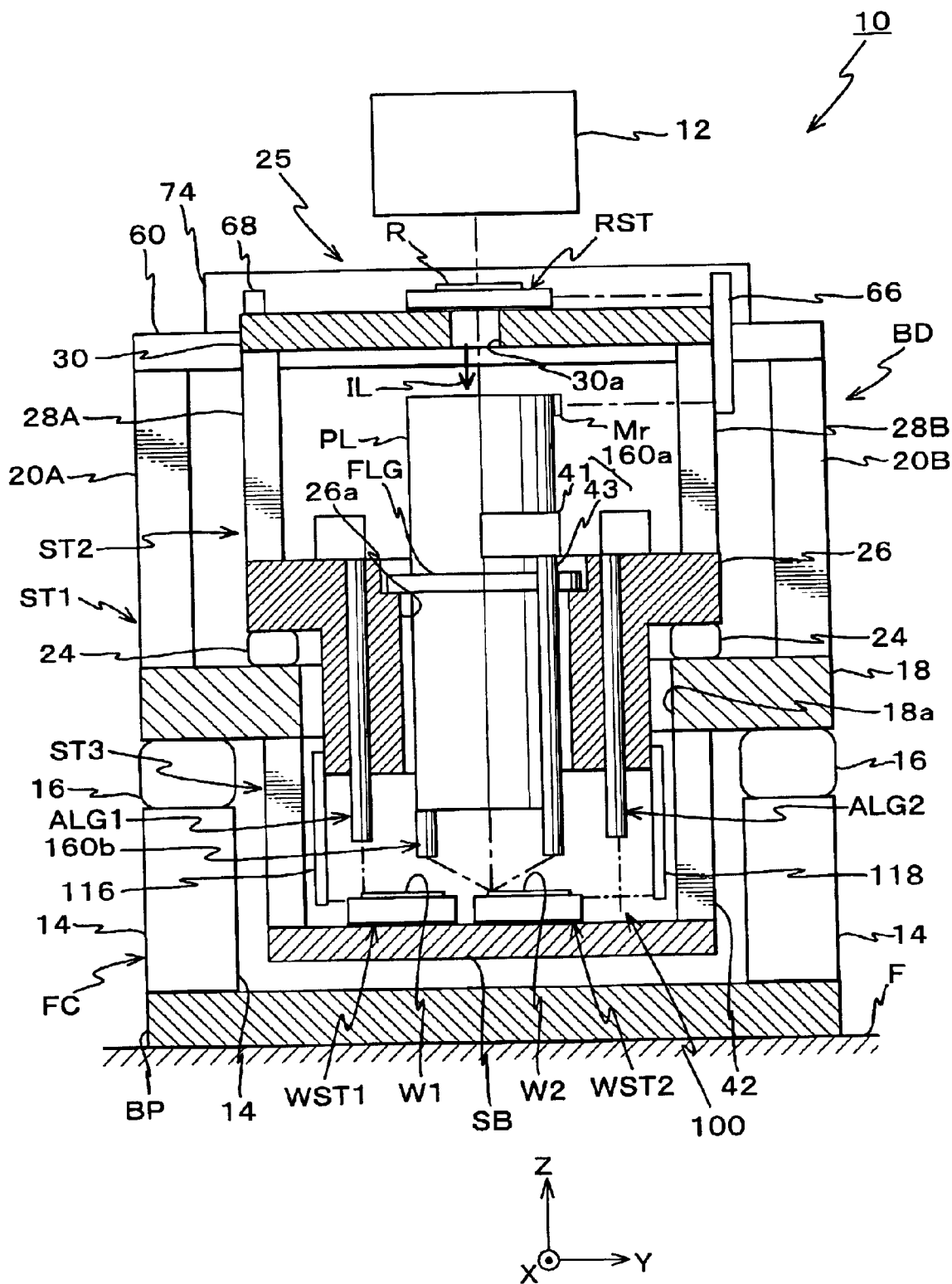
FIG. 1 is a view of an entire configuration of an exposure apparatus related to an embodiment in the present invention.

An embodiment of the present invention is described below, referring to FIGS. 1 to 12B. FIG. 1 shows a schematic view of an exposure apparatus related to the embodiment partially sectioned.

The exposure apparatus, referred to as exposure apparatus 10, is a scanning exposure apparatus based on a step-and-scan method, or a so-called scanning stepper that transfers a circuit pattern formed on a reticle R serving as a mask onto each shot area on a wafer W1 (or W2) serving as a substrate via a projection optical system PL, while driving reticle R and wafer W1 (or W2) synchronously in a one-dimensional direction (in this case, a Y-axis direction which is in the horizontal direction of the page surface).

Exposure apparatus 10 comprises: an illumination system 12 that includes a light source; a reticle stage RST serving as a stage main body that holds reticle R; projection optical system PL that projects an illumination light IL emitted from reticle R onto wafer W1 and wafer W2; wafer stages WST1 and WST2 serving as a stage main body that hold wafers W1 and W2, respectively; a main body column BD that movably supports reticle stage RST and wafer stages WST1 and WST2 as well as hold projection optical system PL, and the like.

As is disclosed in, for example, Japanese Patent Application Laid-open No. 06-349701 and its corresponding U.S.

Pat. No. 5,534,970, illumination system 12 is configured including a light source, an illuminance uniformity optical system including parts such as an optical integrator (a fly-eye lens, an internal reflection type integrator, a diffraction optical element, or the like), and an illumination optical system made up of parts such as a relay lens, a variable ND filter, a reticle blind, and a dichroic mirror (all of which are not shown). Illumination system 12 illuminates a slit shaped illumination area set with the reticle blind on reticle R on which the circuit pattern or the like is formed with illumination light IL, with an almost uniform illuminance. And, in this case, as illumination light IL, light in the far ultraviolet region such as a KrF excimer laser beam (wavelength 248 nm) or light in the vacuum ultraviolet region such as an ArF excimer laser beam (wavelength 193 nm) or an $F_2$ laser beam (wavelength 157 nm) can be used. Also, as illumination light IL, an emission line (such as a g-line or an i-line) in an ultraviolet region emitted from an ultra-high pressure mercury lamp can be used. As long as the national laws in designated states or elected states, to which this international application is applied, permit, the disclosures of the Japanese Patent Application Laid-open and the U.S. Patent cited above are fully incorporated herein by reference.

Figure 7:
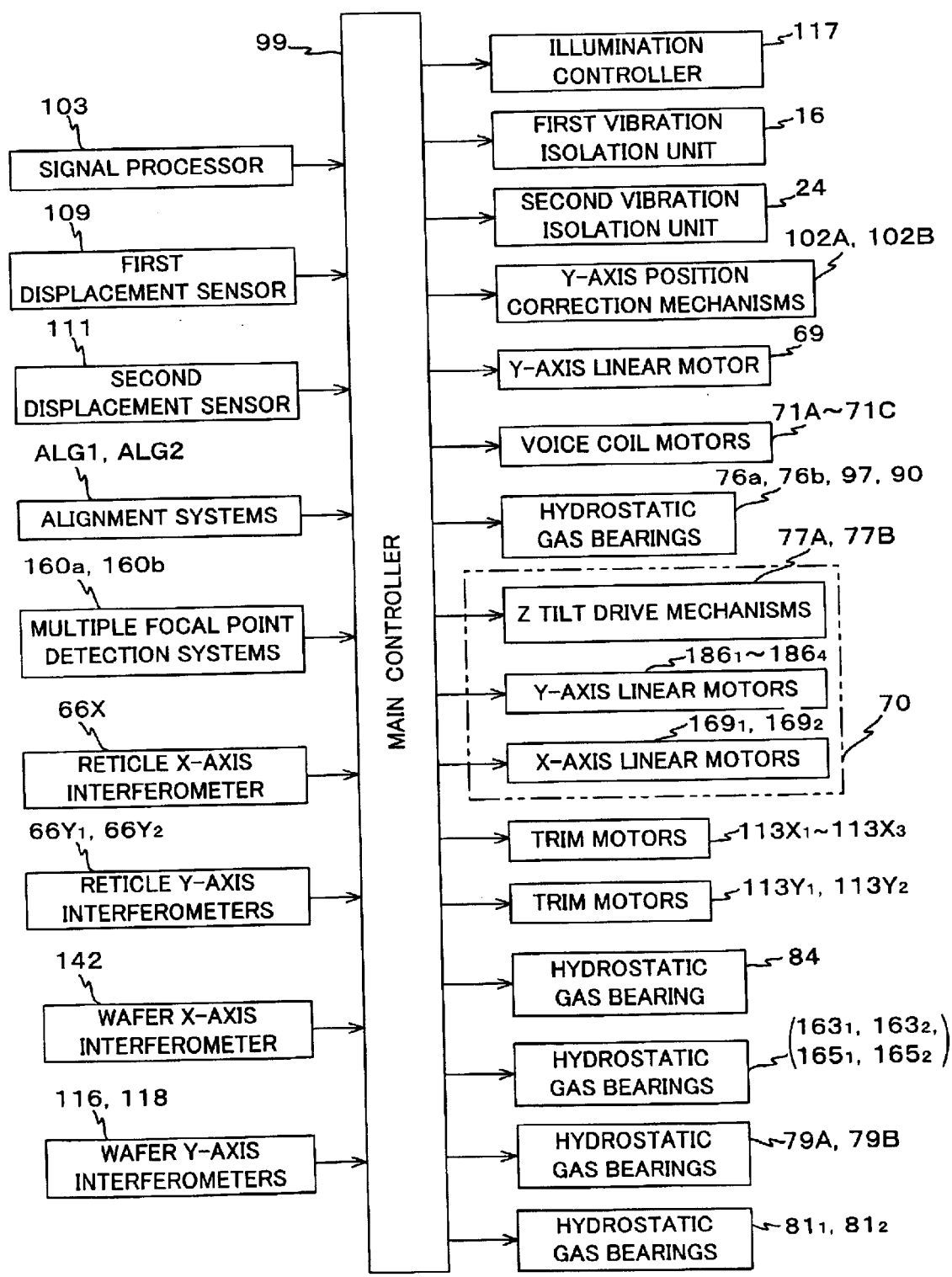
FIG. 7 is a block diagram of a control system of an exposure apparatus in an embodiment.

Each drive portion within the illumination system, that is, parts such as the variable ND filter and the reticle blind are under the control of an illumination controller (exposure controller) 117 (not shown in FIG. 1, refer to FIG. 7), which operates responding to instructions from a main controller 99 (not shown in FIG. 1, refer to FIG. 7).

Main column BD comprises: a rectangular shaped base plate BP serving as a support platform arranged horizontally on a floor surface F of the clean room; four first struts 14 arranged on the four corners of base plate BP extending at a predetermined length in a vertical direction (two of the first struts 14 arranged at positions near the page surface in FIG. 1 are not shown); a first frame ST1 supported at four points by the first struts 14, respectively, via first vibration isolation units 16 (two of the first vibration isolation units 16 arranged at positions near the page surface in FIG. 1 are not shown) serving as drivers; a second frame ST2 supported at four points by four second vibration isolation units 24 (two of the second vibration isolation units 24 arranged at positions near the page surface in FIG. 1 are not shown) arranged on the first frame ST1 serving as drivers; a third frame ST3 supported by suspension underneath the first frame ST1, and the like. And, of these parts, base plate BP and the four first struts 14 make up a frame caster FC.

The first frame ST1 comprises: a base frame 18 that structures its bottom plate portion; two second struts 20A and 20B that are arranged fixed on two corners of the upper surface of base frame 18 located in the depth of the pager surface in FIG. 1 extending in the vertical direction; and a rectangular plate shaped Y-axis stator support plate 60 that is supported almost horizontally with the two second struts 20A and 20B.

Base frame 18 is made up of a rectangular frame shaped plate member in which a rectangular opening 18a is formed in the center, and is supported almost horizontally at the bottom surface close to the four corners by the first vibration isolation units 16. Each of the first vibration isolation units 16 has a configuration including a mechanical damper that can bear heavy weight such as an air damper or an oil-pressure damper arranged in series (or in parallel) on the upper portion of the first strut 14 and an electromagnetic damper made up of an electromagnetic actuator such as a voice coil motor. And, an angle of inclination with respect to the horizontal plane on the upper surface of base frame 18 is detected with a first displacement sensor 109 (not shown in FIG. 1, refer to FIG. 7), and based on the detection values of the first displacement sensor 109, main controller 99 (refer to FIG. 7) drives the electromagnetic dampers making up the four first vibration isolation units 16 so that the angle of inclination is within a permissible range, as well as control the pneumatic pressure or hydraulic pressure of the mechanical dampers if necessary. In this case, due to the mechanical dampers, vibration of a high frequency from the floor is attenuated before it travels to exposure apparatus 10, and the remaining vibration with a low frequency is attenuated with the electromagnetic dampers. As the displacement sensor, for example, an electric level or an optical inclination detector or the like can be used, attached to base frame 18.

Y-axis stator support plate 60 is made up of a plate member having a rectangular shape when viewed from above, and a Y-axis stator, which will be describe later, is arranged on its upper surface.

The second frame ST2 comprises: a projection optical system support member 26 supported from below at four points with the four second vibration isolation units 24 arranged on the upper surface of base frame 18; four third struts 28A, 28B, 28C, and 28D (the third struts 28C and 28D arranged near the page surface of FIG. 1 are not shown, refer to FIG. 2) that are arranged fixed on the upper surface of projection optical system support member 26 at positions facing the second vibration isolation units 24, respectively, extending in the vertical direction at a predetermined length; and a reticle stage base 30 that serves as a supporting member, being supported almost horizontally with the four third struts 28A to 28D.

Projection optical system support member 26 is made up of a cylindrical shaped member that has a flange portion formed on its upper end portion. A stepped opening 26a is formed in the center of projection optical system support member 26 that has a circular shape in a planar view (when viewed from above) and creates a communicative connection in the vertical direction (a Z-axis direction). And, in stepped opening 26a, projection optical system PL is inserted from above and projection optical system support member 26 supports projection optical system PL via a flange portion PL provided almost at the center in the height direction.

In addition, in projection optical system support member 26, besides stepped opening 26a, a plurality of through holes are provided in the vertical direction (the Z-axis direction) and a plurality of barrels that make up various detection systems are inserted in these through holes. Such detection systems will be described, later in the description.

Each of the second vibration isolation units 24 has a structure similar to the first vibration isolation units 16 (however, the withstand load is set lower than that of the first vibration isolation units 16). And, an angle of inclination with respect to the horizontal plane on the upper surface of projection optical system support member 26 or the upper surface of reticle stage base 30 is detected with a second displacement sensor 111 (not shown in FIG. 1, refer to FIG. 7), and based on the detection values of the second displacement sensor 111, main controller 99 (refer to FIG. 7) controls the four second vibration isolation units 24 so that the angle of inclination is within a permissible range. That is, in the embodiment, each of the second vibration isolation units 24 makes up a driver that drives the second frame ST2 including reticle stage base 30 in the Z-axis direction, and at the same time the four second vibration isolation units 24 make up a driver that drives the second frame ST2 in a direction of inclination with respect to an XY plane.

Incidentally, as the displacement sensor, for example, an electric level or an optical inclination detector or the like can be used that are attached to projection optical system support member 26 or reticle stage base 30.

Figure 2:
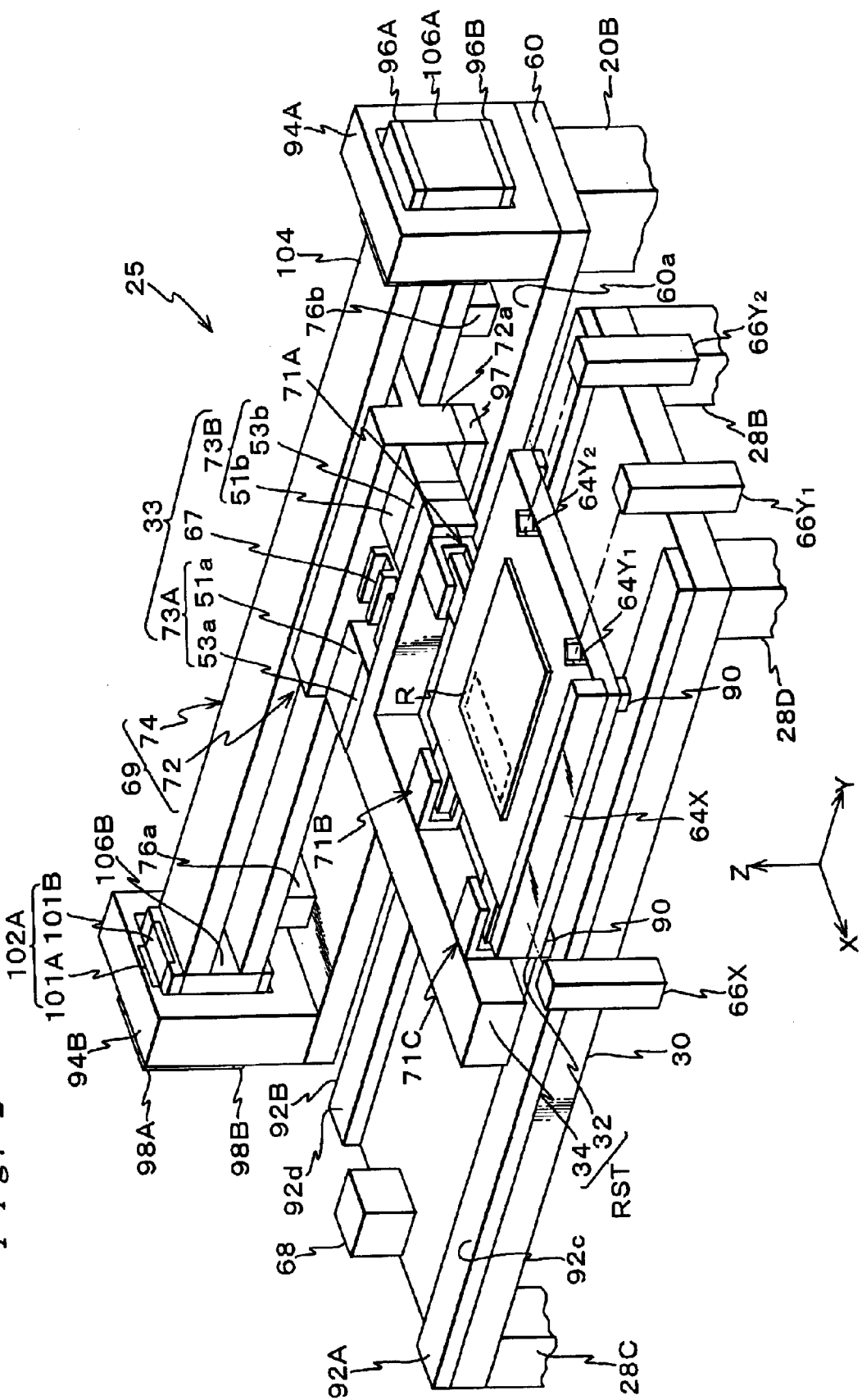
FIG. 2 is a perspective view of a reticle stage unit and its neighboring area.

As is shown in FIG. 2, reticle stage base 30 is made up of a plate member that has a rectangular shape in a planar view (when viewed from above), and an opening 30a (not shown in FIG. 2, refer to FIG. 1) through which illumination light IL passes is formed in the center of reticle stage base 30. On the upper surface of reticle stage base 30 at the edge portion on one side and the other side in the X-axis direction, air guides 92A and 92B are arranged, respectively, extending in the Y-axis direction. The upper surface of air guides 92A and 92B are processed into a surface that has an extremely good degree of flatness, and these surfaces make up guide surfaces 92c and 92d that serve as a movement plane of reticle stage RST.

Reticle stage RST is supported by levitation on the upper surface of reticle stage base 30 with a plurality of hydrostatic gas bearings 90. Reticle stage RST comprises a reticle fine movement stage 32 that holds reticle R by vacuum chucking or the like, and a reticle coarse movement stage 34 that moves in predetermined strokes integrally with reticle fine movement stage 32 in the Y-axis direction, which is the scanning direction. For the sake of convenience, however, reticle fine movement stage 32 and reticle coarse movement stage 34 are representatively shown together as reticle stage RST in FIG. 1.

In addition, as is shown in the perspective view in FIG. 2, reticle Y-axis interferometers $66Y_1$, $66Y_2$ and a reticle X-axis interferometer 66X that measure the position of reticle fine movement stage 32 and an interferometer laser 68 that emits length measurement beams via each interferometer are provided in reticle stage base 30. The interferometers measure the two-dimensional position of reticle fine movement stage 32 and its angle of rotation with high precision, and based on the measurement results, main controller 99 (refer to FIG. 7) controls the position and speed of reticle fine movement stage 32. In FIG. 1, the three interferometers are shown together as a reticle interferometer 66.

In addition, although they are not shown in FIG. 2, fixed mirrors that correspond to reticle interferometers $66Y_1$, $66Y_2$, and 66X serving as reference mirrors, respectively, are provided on the side surface of projection optical system PL. These fixed mirrors are representatively shown as a fixed mirror Mr in FIG. 1.

Furthermore, above Y-axis stator support plate 60, a Y-axis stator 74 is arranged. Y-axis stator 74 is a stator in a linear motor for driving reticle coarse movement stage 34 in the Y-axis direction, and also functions as a counter mass by moving in the direction opposite to the reticle coarse movement stage 34 along the Y-axis direction in order to cancel the reaction force generated when reticle coarse movement stage 34 is driven.

In the embodiment, reticle stage RST, its drive system, and the like make up a reticle stage system serving as a first drive system. Details on a configuration of the reticle stage system will be referred to later in the description.

Referring back to FIG. 1, a reduction system is used as projection optical system PL that is double telecentric on both the object plane side (the reticle side) and the image plane side (the wafer side), having a reduced magnification of ¼ (or ⅕). Therefore, when illumination light IL (ultraviolet pulse light) is irradiated on illumination system 12, image forming beams outgoing from the part illuminated by the ultraviolet pulse light in a circuit pattern area formed on reticle R enter projection optical system PL, and a partially inverted image of the circuit pattern is formed in the center of a field on the image plane side of projection optical system PL with each pulse irradiation of the ultraviolet light, limited in a narrow slit shape or a rectangular shape (a polygon) extending in the X-axis direction. With this operation, the partially inverted image of the projected circuit pattern is reduced and transferred onto a layer of resist on a surface of a shot area among a plurality of shot areas on wafer W1 (or wafer W2) arranged on the image forming plane of projection optical system PL.

As projection optical system PL, when an ArF excimer laser is used as the light source, a refraction system is manly used that is made up of only refection optical elements (lens elements). When using an $F_2$ laser, however, a so-called catadioptric system (a reflection refraction system), which is a combination of refraction optical elements and reflection optical elements (such as a concave mirror or a beam splitter), or a reflection optical system consisting of only reflection optical elements are mainly used. Details on such systems are disclosed in, for example, Japanese Patent Application Laid-open Nos. 03-282527 and 08-171054 and the corresponding U.S. Pat. No. 5,668,672, and in Japanese Patent Application Laid-open No. 10-20195 and the corresponding U.S. Pat. No. 5,835,275. As long as the national laws in designated states or elected states, to which this international application is applied, permit, the disclosures of the U.S. Patents cited above are each fully incorporated herein by reference. However, a refraction system may be possibly used, when the $F_2$ laser is used as a light source.

Third frame ST3 comprises: a stage base SB, serving as a supporting member, which is arranged below projection optical system PL almost parallel with base plate BP; and four base support members 42 (however, base support members arranged near the page surface are not shown) that provide suspension support to stage base SB, being suspended from the bottom surface of base frame 18). And, above the upper surface of stage base SB, wafer stages WST1 and WST2 are supported by levitation via bearings of a non-contact type, such as hydrostatic gas bearings.

Wafer stages WST1 and WST2 are each driven by a wafer stage drive system 70 (refer to FIG. 7) made up of parts such as linear motors or the like. The stages move continuously in the Y-axis direction, as well as perform stepping movements in the X-axis direction and Y-axis direction.

Furthermore, in wafer stage WST1, a wafer table TB1 is incorporated for finely driving wafer W1 in directions of three degrees of freedom, in the Z-axis direction, an θx direction (the rotational direction around the X-axis), and a θy direction (the rotational direction around the Y-axis), in order to perform leveling and focusing on wafer W1. Likewise, in wafer stage WST2, a wafer table TB2 is incorporated for finely driving wafer W1 in directions of three degrees of freedom, in the Z-axis direction, the θx direction, and the θy direction, in order to perform leveling and focusing on wafer W2.

In the embodiment, wafer stages WST1 and WST2 and their drive system make up a wafer stage system serving as a second drive system. Details on wafer stage system will be referred to later in the description.

Furthermore, in the embodiment, as is shown in FIG. 1, barrels that structure alignment systems ALG1 and ALG2 are inserted, respectively, in a pair of through holes formed penetrating projection optical system support member 26 in the vertical direction. And, sensor heads that configure alignment systems ALG1 and ALG2 are arranged on the upper surface of projection optical system support member 26, at positions corresponding to each of the barrels.

Furthermore, in the periphery of projection optical system PL, a multiple focal point detection system is arranged at positions at an oblique angle of 45° from the center of projection optical system PL with respect to the X-axis and the Y-axis. The multiple focal point detection system is one of a focus detection system (focal point detection system) based on an oblique incident method that is used to detect the position within an exposure area (an area conjugate with the illumination area on reticle R irradiated with illumination light IL) on the surface of wafer W1 (or W2) and in its neighboring area in the Z axis direction. The multiple focal point detection system is made up of an irradiation optical system 160a and a photodetection optical system 160b (only the barrel portion of photodetection optical system 160b is shown). Irradiation optical system 160a is made up of a sensor head 41 and a barrel 43, and it comprises inside an optical fiber bundle, a pattern forming plate, a mirror, a lens, or the like (all of them not shown), whereas photodetection optical system 160b comprises inside a rotational direction vibration plate, a photodetection slit plate, a lens, a photodetector that has many photosensors, or the like (all of them not shown).

In the multiple focal point detection system (160a and 160b), illumination optical system 160a irradiates a detection beam in a relatively broad wavelength band having low sensitivity to the photoresist on wafer W1 (or W2) from an oblique direction, and the detection beam reflected off the surface of wafer W1 (or W2) is photo-detected by photodetection optical system 160b. The beam (image) photo-detected by photodetection optical system 160b is synchronously detected in rotational vibration frequency signals with a signal processor 103 (not shown in, FIG. 1, refer to FIG. 7). Then, a large number of focus signals obtained due to synchronous detection by signal processor 103 are supplied to main controller 99 in FIG. 7.

In addition, wafer Y-axis interferometers 116 and 118 are arranged at the lower half portion of the side walls on both sides of the Y-axis direction of projection optical system support member 26. Also, a wafer X-axis interferometer 142 (not shown in FIG. 1, refer to FIG. 7) is arranged at the lower half portion of the side wall in the −X-axis side of projection optical system support member 26 for detecting the position of wafer stages WST1 and WST2 in the X-axis direction. These interferometers 116, 118, and 142 emit laser beams generated by laser heads (not shown) arranged on the upper surface of projection optical system support member 26 toward wafer stages WST1 and WST2, via an optical relay system (not shown) made up of a beam splitter, a mirror, or the like provided within projection optical system support member 26.

Although it is omitted in the drawings, wafer Y-axis interferometers 116 and 118 have a length measurement axis that passes through the optical axis of projection optical system PL and the optical axes of alignment systems ALG1 and ALG2. In addition, wafer X-axis interferometer 42 has a length measurement axis that is perpendicular to each of the length measurement axes of wafer Y-axis interferometers 116 and 118 and the optical axis of projection optical system PL, a length measurement axis that is perpendicular to the optical axis of alignment system ALG1, and a length measurement axis that is perpendicular to the optical axis of alignment system ALG2. And, due to such an arrangement, when exposure is performed using projection optical system PL and also when wafer alignment is performed using alignment systems ALG1 or ALG2, the position of wafer stages WST1 and WST2 can be measured without the so-called Abbe error.

In exposure apparatus 10 in the embodiment, the image of the pattern in the illumination area of reticle R is projected on a rectangular slit-shaped exposure area on wafer W1 (or W2) which surface is coated with a resist, via projection optical system PL at a projection magnification β (β is a ¼ magnification or a ⅕ magnification or the like). And, by moving reticle R and wafer W1 (or W2) synchronously in a predetermined scanning direction (the Y-axis direction) in this state, the pattern of reticle R is transferred onto one of the shot areas on wafer W1 (or W2). That is, scanning exposure is performed.

FIG. 2 shows a perspective view of the entire reticle stage system 25 serving as the first drive system (stage system) that includes reticle stage RST, its drive system, or the like. Following is a detailed description on reticle stage system 25.

As is previously described, reticle stage RST is structured including reticle fine movement stage 32 and reticle coarse movement stage 34, and reticle coarse movement stage 34 is driven in the Y-axis direction with a Y-axis linear motor 69.

Y-axis linear motor 69 comprises: Y-axis stator 74, which is provided above Y-axis stator support plate 60; and a Y-axis mover 72, which moves in the Y-axis direction along Y-axis stator 74.

Y-axis stator 74 comprises: a stator yoke 104, which is longitudinal in the Y-axis direction and has a groove in the shape of a letter U in section (a sideways U-shape) formed on the +X side surface at a predetermined depth; and block shaped members 106A and 106B that are fixed to stator yoke 104 on both ends of the longitudinal direction. On a pair of opposed surfaces (vertically opposed surfaces) in the space inside stator yoke 104, the N-pole of a permanent magnet and the S-pole of a permanent magnet are alternately arranged along the Y-axis direction at a predetermined interval. In this case, the magnets that are opposing each other are of different types (that is, the N-pole permanent magnet is arranged facing the S-pole permanent magnet, making up a pair of magnets at each position). The N-pole permanent magnet and the S-pole permanent magnet, in this case, refer to permanent magnets which surface facing the Y-axis mover 72 is an N-pole surface and an S-pole surface, respectively. Accordingly, in the space in Y-axis stator 74, an alternating magnetic field of a predetermined cycle is generated along the Y-axis direction.

On the lower surface side of stator yoke 104 on both ends in the longitudinal direction, a pair of hydrostatic gas bearings 76a and 76b is arranged, respectively. The bearing surface of these hydrostatic gas bearings 76a and 76b opposes a movement plane serving as a guide surface (hereinafter referred to as "the second reticle guide surface") 60a of the stator formed on the upper surface of Y-axis stator support plate 60. Hydrostatic gas bearings 76a and 76b each exhaust pressurized gas such as pressurized air toward the second reticle guide surface 60a, and by balancing the static pressure of the pressurized gas and the weight of Y-axis stator 74, Y-axis stator 74 is supported by levitation above the second reticle guide surface 60a via a clearance of around several μm.

In addition, Y-axis stator 74 is held in a non-contact manner by frame bodies 94A and 94B fixed on both ends of the upper surface of Y-axis stator support plate 60 in the Y-axis direction, into which block shaped members 106A and 106B located on both ends of Y-axis stator 74 in the Y-axis direction are inserted. That is, hydrostatic gas bearings (not shown) are provided in both inner surfaces of each of the frame bodies 94A and 94B in the X-axis direction. Pressurized gas is exhausted from these hydrostatic gas bearings toward both side surfaces of member 106A and member 106B in the X-axis direction, and due to the balance between the static pressure of the pressurized gas, members 106A and 106B are held in frame bodies 94A and 94B, respectively, via a clearance of around several μm in the X-axis direction. Incidentally, not only is Y-axis stator 74 held in a non-contact manner in the Z-axis direction by hydrostatic gas bearings 76a and 76b with respect to the second reticle guide surface 60a of Y-axis stator support plate 60, but is also held in a non-contact manner with a space of several μm with respect to frame bodies 94A and 94B. Thus, Y-axis stator 74 is engaged in a non-contact manner in both the X-axis direction and the Z-axis direction.

As is obvious from FIG. 2, the first frame ST1 including Y-axis stator support plate 60 on which the second reticle guide surface 60a is formed is provided independent from reticle stage base 30 vibration-wise, and the first frame ST1 makes up a support mount that movably supports Y-axis stator 74.

In addition, an upper plate member 96A and a lower plate member 96B are fixed, respectively, on the upper surface and the lower surface of member 106A provided in one end of Y-axis stator 74 in the Y-axis direction (the +Y end). Also, an upper unit holding member 98A and a lower unit holding member 98B are fixed, respectively, on the upper surface and the lower surface of member 106B provided in the other end of Y-axis stator 74 in the Y-axis direction (the −Y end). Upper unit holding member 98A is made of a thin-walled member that has a U-shaped cross sectional view in the XZ plane, and an armature unit 101B is embedded in a concave groove in its center. Inside armature unit 101B, armature coils are arranged along the Y-axis direction at a predetermined interval. Lower unit holding member 98B is structured similar to upper unit holding member 98A, and a similar armature unit is embedded in lower unit holding member 98B. Furthermore, at a position opposing armature unit 101B of frame body 94B, a magnetic pole unit 101A is provided. Armature unit 101B and magnetic pole unit 101A make up a Y-axis position correction mechanism 102A that drives Y-axis stator 74 in the Y-axis direction. Similarly, a Y-axis position correction mechanism 102B (not shown in FIG. 2, refer to FIG. 7) is formed in the lower unit holding member 98B side.

In this case, the mass of member 106A on one end of Y-axis stator 74 in the Y-axis direction, upper plate member 96A, and lower plate member 96B together, and the mass of member 106B on the other end in the Y-axis direction, upper unit holding member 98A, armature unit 101B, a lower unit holding member 98B, and its armature unit (not shown) together are set the same. Accordingly, since the center of gravity acts on the center of gravity position of Y-axis stator 74, hydrostatic gas bearings 76a and 76b that are both equally spaced from the center of gravity and perform the same operation can be controlled in a simple manner.

As is described, Y-axis stator 74 is engaged in a non-contact manner in the X-axis direction and the Z-axis direction; however, it is not engaged in any way in the Y-axis direction. Therefore, when reticle stage RST is driven in the Y-axis direction with the Y-axis mover (to be described later), a reaction force is generated in Y-axis stator 74 in the direction opposite to the direction in which reticle stage RST is driven. When the reaction force is generated, Y-axis stator 74 moves in the Y-axis direction corresponding to the reaction force, in the opposite direction to the drive direction of reticle stage RST. In this case, law of conservation of momentum holds, and the reaction force acting on Y-axis stator 74 is almost completely absorbed. In addition, offset load due to shift in the center of gravity does not occur. Accordingly, vibration occurring due to the reaction force generated by the drive of reticle stage RST can be almost completely prevented. In this case, the mass of Y-axis stator 74 is set several times heavier (for example, 4 to 6 times) than the mass of reticle stage RST and Y-axis mover 72 together.

In the embodiment, in order to keep the movement amount of Y-axis stator 74 in the Y-axis direction due to the reaction force acting when reticle stage RST is driven within the range of strokes of Y-axis position correction mechanisms 102A and 102B, main controller 99 in FIG. 7 controls the current supplied to the armature coils of the armature units in Y-axis position correction mechanisms 102A and 102B for driving in the Y-axis direction, so that Y-axis stator 74 returns to its original position in the Y-axis direction at an appropriate timing.

Y-axis mover 72 comprises: a member 72a that has a T-shape in a side view, and a part corresponding to the leg of the letter T is inserted into the space inside Y-axis stator 74 extending in the Y-axis direction at a predetermined length; and a plurality of armature coils (not shown) that are arranged at a predetermined interval along the Y-axis direction in the space inside member 72a, in the part corresponding to the leg of the letter T. When a current is supplied to the armature coils of Y-axis mover 72, the electromagnetic interaction between the current and the alternating magnetic field generated in the space inside Y-axis stator 74 generates a Lorentz force (thrust) that drives the Y-axis mover 72 in the Y-axis direction. That is, Y-axis stator 74 and Y-axis mover 72 make up a moving coil type Y-axis liner motor 69, which drives reticle stage RST in predetermined strokes in the Y-axis direction. Incidentally, main controller 99 shown in FIG. 7 controls the current value (including the direction of the current) supplied to the armature coils that structure the Y-axis mover 72 of Y-axis linear motor 69.

In addition on the surface on the −X side of member 72a in the portion opposing the Y-axis stator 74, hydrostatic gas bearings (not shown) are provided so that Y-axis mover 72 can be finely driven in the X-axis direction, as well as be finely driven in the rotational direction around the Z-axis. Furthermore, hydrostatic gas bearings 97 are provided on the bottom surface of member 72a, and by the static pressure of pressurized gas exhausted from hydrostatic gas bearings 97 toward the second reticle guide surface 60a, Y-axis mover 72 is supported by levitation above the second reticle guide surface 60a via a clearance of around several μm. As hydrostatic gas bearings 97, a vacuum preload type hydrostatic gas bearing is preferably used.

Reticle coarse movement stage 34 has a shape of the letter L in a planar view (from above), and is fixed to the side surface of Y-axis mover 72 on the +X side via a connection mechanism 33 in a state hanging over reticle stage base 30 in a cantilever support. And, although it is not shown, a plurality of hydrostatic gas bearings similar to hydrostatic gas bearings 76a and 76b described earlier are provided on the bottom surface of reticle coarse movement stage 34, at positions opposing first reticle guide surfaces 92c and 92d.

Reticle fine movement stage 32 is made up of a member that is rectangular shaped in a planar view (from above), and a rectangular shaped opening (not shown), which serves as a passage of illumination light IL, is formed in the center. In the periphery of the opening, on the upper surface side, a plurality of vacuum chucks (for example, four) is provided (not shown), and these vacuum chucks hold reticle R by vacuum chucking.

In addition, on the four corners of the lower surface (bottom surface) of reticle fine movement stage 32, hydrostatic gas bearings 90 that were referred to earlier and are similar to hydrostatic gas bearings 76a and 76b are provided (however, the bearings in depth of the page surface of FIG. 2 are not shown). Hydrostatic gas bearings 90 are arranged at positions opposing the first reticle guide surfaces 92c and 92d, which are the upper surfaces of air guides 92A and 92B on reticle stage base 30. And by blowing pressurized gas (such as pressurized air) toward the first reticle guide surfaces 92c and 92d, reticle fine movement stage 32 is supported by levitation above guide surfaces 92c and 92d via a clearance of around several μm, due to the balance between the static pressure of the pressurized gas and the total force of the vacuum preload force and the weight of the reticle fine movement stage 32 itself.

Furthermore, as is shown in FIG. 2, a reticle X movable mirror 64X made of a plane mirror is fixed on the +X end portion on the upper surface of reticle fine movement stage 32. Length measurement beams from reticle X-axis interferometer 66X are irradiated perpendicularly on X movable mirror 64X. In addition, a pair of corner cubes $64Y_1$ and $64Y_2$ is fixed on the upper surface of reticle fine movement stage 32 on the +Y end portion, and length measurement beams from reticle Y-axis interferometers $66Y_1$ and $66Y_2$ are irradiated on the corner cubes $64Y_1$ and $64Y_2$, respectively. Incidentally, the length measurement beams from interferometers 66X, $66Y_1$, and $66Y_2$ are beams split from the laser beam generated by interferometer laser 68 fixed on the upper surface of reticle stage base 30.

And, with reticle Y-axis interferometers $66Y_1$ and $66Y_2$, the position of reticle fine movement stage 32 in the Y-axis direction and the θz rotation is detected at all times at a resolution such as around 0.5 to 1 nm with a fixed mirror as a reference, whereas with reticle X-axis interferometer 66X, the position of reticle fine movement stage 32 in the X-axis direction is detected at all times at a resolution such as around 0.5 to 1 nm with a fixed mirror as a reference.

In this case, since a pair of a double pulse interferometer is used as reticle Y-axis interferometers $66Y_1$ and $66Y_2$ that detects the position of corner cubes $64Y_1$ and $64Y_2$ in the Y-axis direction by receiving the reflection light of the length measurement beams projected on corner cubes $64Y_1$ and $64Y_2$, the projection position of each of the length measurement beams in the Y-axis direction can be accurately detected even if a θz rotation is confirmed in reticle fine movement stage 32.

Three voice coil motors 71A, 71B, and 71C are arranged in between reticle fine movement stage 32 and reticle coarse movement stage 34. Of the voice coil motors, voice coil motor 71A finely drives reticle fine movement stage 32 in the X-axis direction, having a mover fixed on the −X side end surface of reticle fine movement stage 32 and a stator fixed opposing the mover on a surface on the +X side of the reticle coarse movement stage 34. The remaining voice coil motors 71B and 71C finely drive reticle fine movement stage 32 in the θz direction, each having a mover fixed on the −Y side end surface of reticle fine movement stage 32 and a stator fixed opposing the mover on a surface on the +Y side of the reticle coarse movement stage 34.

That is, the three voice coil motors 71A to 71C adjust the positional relationship between reticle fine movement stage 32 and reticle coarse movement stage 34 with high response.

As is shown in FIG. 2, connection mechanism 33 comprises: an elastic member 67 that has one end joined to the end surface on the +X side of Y-axis mover 72 by adhesion or the like, and the other end fixed to the end surface on the −X side of reticle coarse movement stage 34; and a pair of electromagnet units 73A and 73B that are respectively arranged on both sides of the Y-axis direction with elastic member 67 in between, and strengthen the connection between Y-axis mover 72 and reticle coarse movement stage 34 by magnetic suction (magnetic force).

As elastic member 67, a flat spring or the like may be used, however, in the embodiment, a flexure is used. Therefore, in the following description, elastic member 67 will be referred to as "flexure 67". In this case, flexure 67 has the characteristics of deforming due to the action of stress in the rotational direction around the Y-axis, and regaining its original state when the stress is released.

Electromagnet unit 73A comprises: an electromagnet 51a that is fixed to the end surface on the +X side of Y-axis mover 72; and an iron plate 53a that is fixed to the end surface on the −X side of reticle coarse movement stage 34. In addition, electromagnet unit 73B is also similarly structured, and comprises an electromagnet 51a and an iron plate 53b. With electromagnet units 73A and 73B, since a current is normally supplied to electromagnet 51a (51b) and iron plate 53a (53b), electromagnet 51a (51b) and iron plate 53a (53b) are tightly joined, and the Y-axis mover 72 and reticle coarse movement stage 34 also mechanically joined.

Next, a wafer stage system 100 serving as the second drive system (stage system) will be described, referring to FIGS. 3 to 7.

Figure 3:
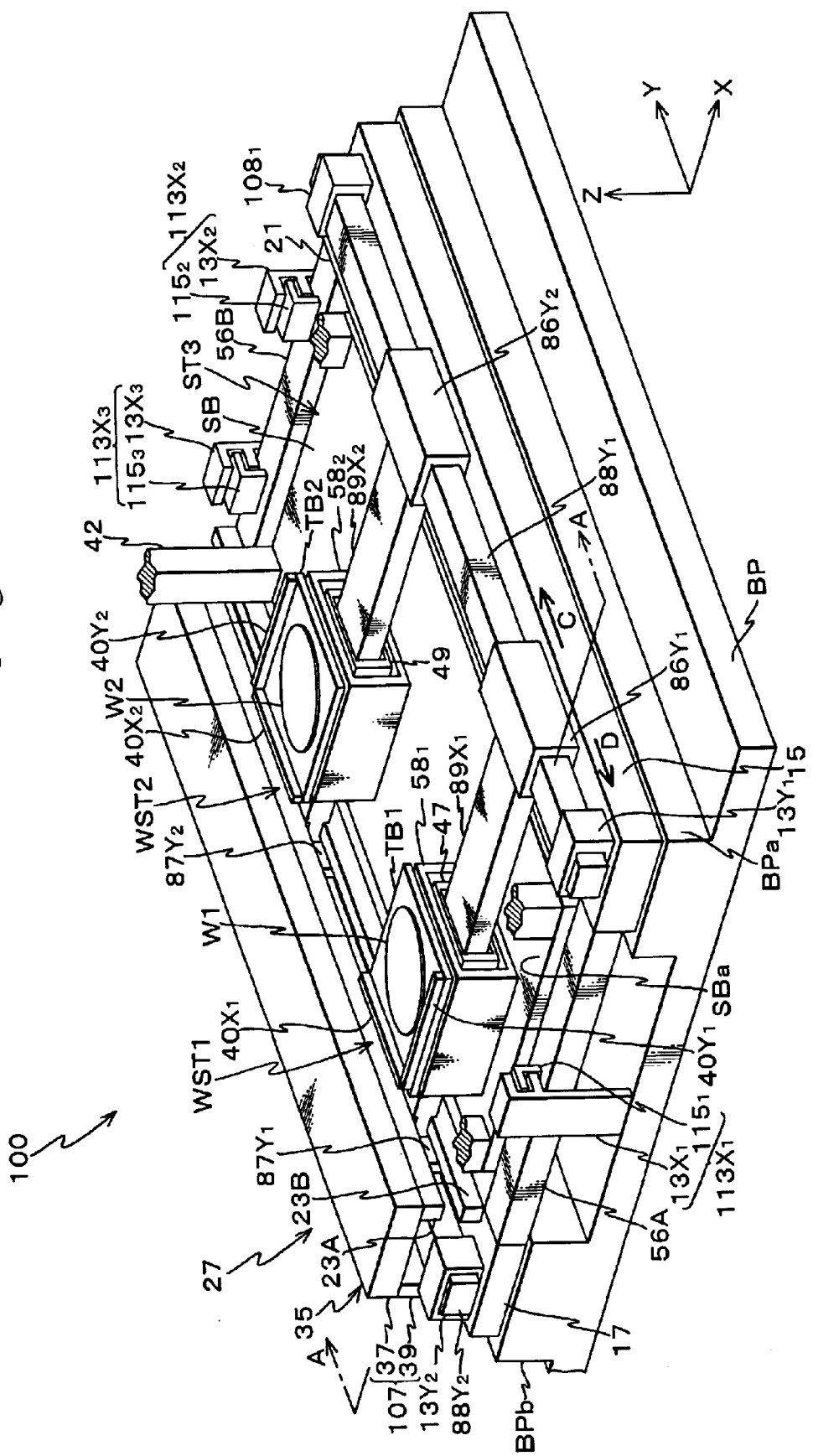
FIG. 3 is a perspective view of a wafer stage unit along with a base plate.

FIG. 3 shows a perspective view of wafer stage system 100 in FIG. 1 on base plate PB with the third frame ST3. As is shown in FIG. 3, wafer stage unit 100 is arranged above base plate BP as a whole.

Wafer stage system 100 is supported above stage base SB that makes up the third frame ST3 in a non-contact manner. Wafer stage system 100 is arranged so that it encloses wafer stages WST1 and WST2, wafer stage drive system 70 (refer to FIG. 7) that drives wafer stages WST1 and WST2, and stage base SB, and it comprises a momentum conservation counterweight 27 (hereinafter simply referred to as "counterweight") (refer to FIG. 4) that has an overall rectangular shape and the like.

As is show in FIG. 3, base plate BP is made of a rectangular plate shaped member in a planar view (from above), and on the upper surface of base plate BP close to the end portions on both sides in the X-axis direction, two projected portions BPa and BPb are respectively arranged, extending in the Y-axis direction. The upper surfaces of projected portions BPa and BPb are processed with a fair degree of flatness. Of projected portions BPa and BPb, the upper surface of projected portion BPb on the −X side is set higher than the upper surface of projection portion BPa on the +X side by a predetermined amount.

Stage base SB is arranged (in actual, supported by suspension) at a position (around the center of base plate BP) in between projected portions BPa and BPb. The surface (upper surface) of stage base SB is processed so that the degree of flatness is extremely high, and it is made into a stage guide surface SBa serving as a movement reference plane when wafer stages WST1 and WST2 move.

Figure 4:
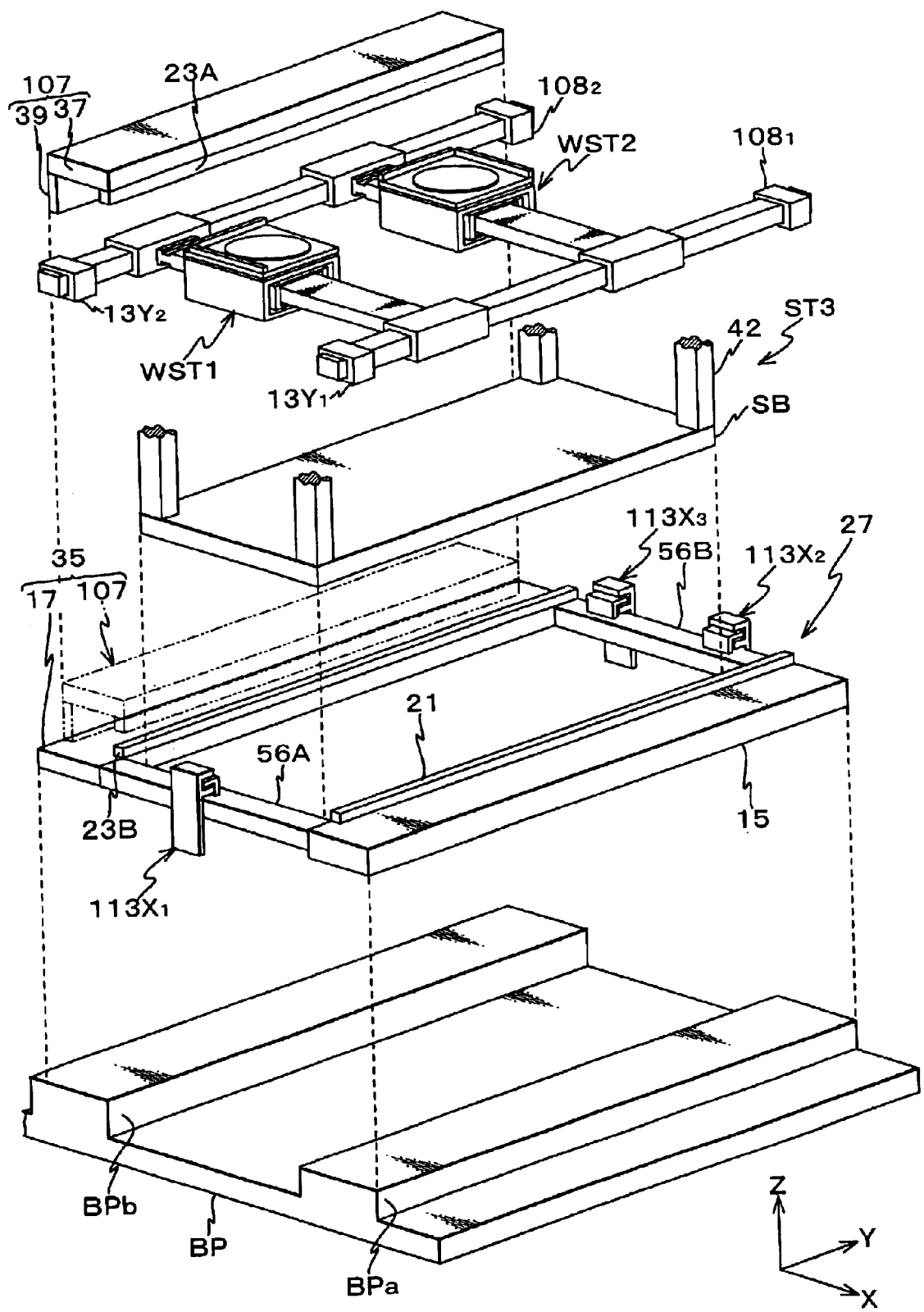
FIG. 4 is an exploded perspective view of the wafer stage unit in FIG. 3.

As is obvious from the exploded perspective view in FIG. 4, counterweight 27 has an overall rectangular frame shape.

As is shown in FIG. 4, counterweight 27 comprises: two plate shaped members 15 and 17 that respectively have a rectangular sectional shape and extend in the Y-axis direction, which is the longitudinal direction, and are arranged in parallel to each other at a predetermined interval in the X-axis direction; a rectangular column shaped connection member 56A that connects one end of plate shape members 15 and 17 in the longitudinal direction together; a rectangular column shaped connection member 56B that connects the other end of plate shape members 15 and 17 in the longitudinal direction together; a guide support member 107 that is shaped in a letter L that is integrally fixed to the upper surface of plate shaped member 17 on the −X side. Among these parts, plate shaped member 17 and guide support member 107 make up a frame body 35 that has a U-shape in a side view, as is shown in FIG. 3. As is obvious also from FIG. 4, plate shaped member 17 is made thin-walled (lower in height) by a predetermined amount than plate shaped member 15.

Upon assembly, counterweight 27, which has the structure above, is arranged on base plate BP. In FIG. 3, which shows the completed state of assembly, plate shaped member 15 is arranged above projected portion BPa on the +X side of base plate BP, whereas plate shaped member 17 is arranged on projected portion BPb on the −X side of base plate BP.

As counterweight 27, materials of high-density metal such as tungsten or lead are used. The entire counterweight 27 does not necessarily have to be made of such high-density metal, however, the part of guide support member 107 is at least preferably formed of tungsten or the like. The reason for this is because in such case, the Z position of the center of gravity point in the entire counterweight 27 can be made higher.

Figure 5:
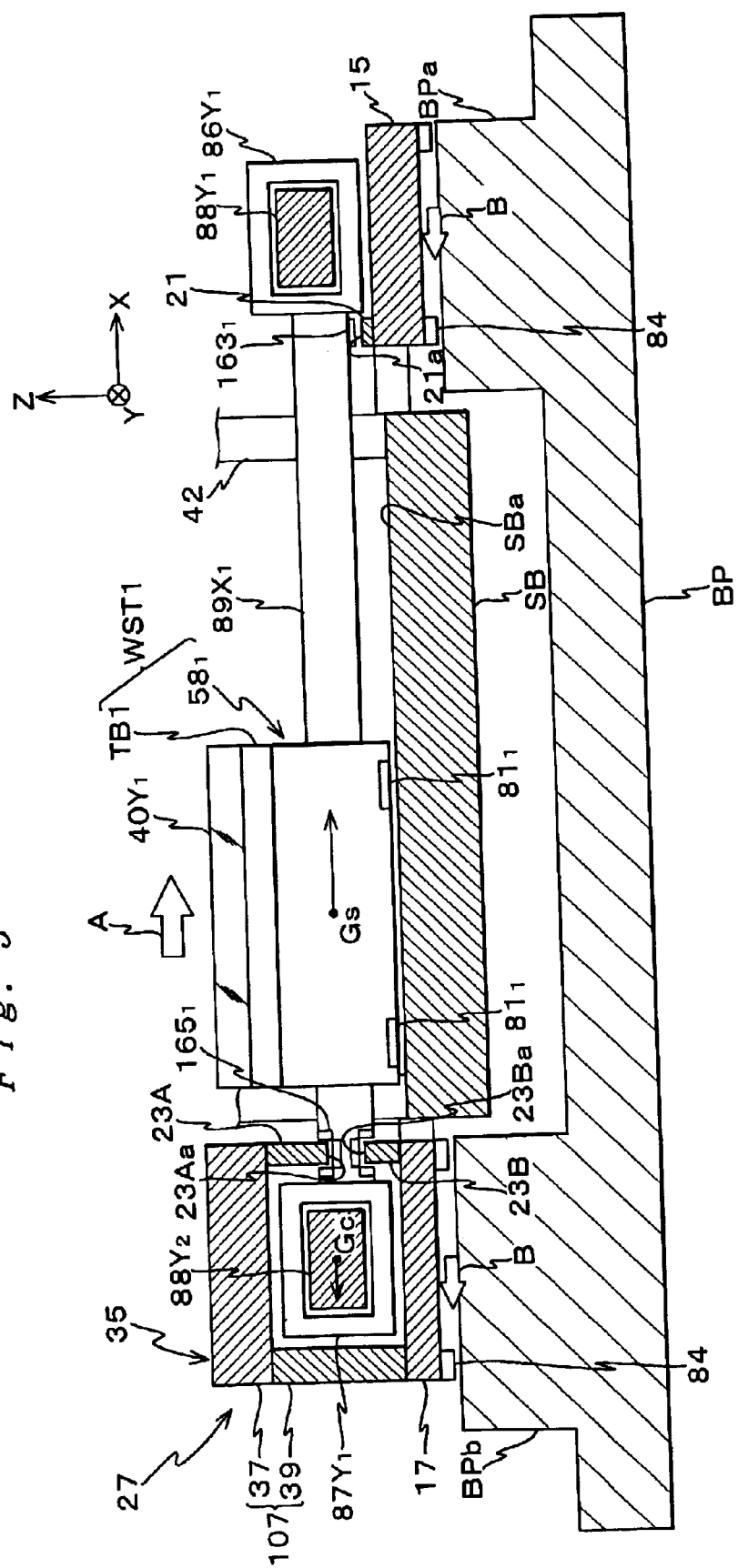
FIG. 5 is a sectional view of line A—A in FIG. 3.

When assembly is completed as is shown in FIG. 3, the upper surfaces of plate shaped members 15 and 17 are set at almost the same height. In addition, as is shown in FIG. 5, which is a sectional view of line A—A in FIG. 3, a plurality of hydrostatic gas bearings 84 are provided on the lower surfaces of plate shaped members 15 and 17. And, with hydrostatic gas bearings 84, plate shaped members 15 and 17 (counterweight 27) are supported by levitation above the upper surface of projected portions BPa and BPb of base plate BP via a clearance of a predetermined amount.

As can be seen from FIGS. 3 and 5 and the like, frame body 35 is made up of plate shaped member 17 and guide support member 107 referred to earlier. Guide support member 107 has 2 portions; a rear plate 39 which lower end surface is fixed to the upper surface of plate shaped member 17 on the end portion on the −X side, and an upper plate 37 supported parallel to plate shaped member 17 by rear plate 39.

In addition, a guide 23A, which is made of a bar shaped member that extends in the Y-axis direction and has a rectangular sectional shape, is fixed on the lower surface of upper plate 37 on the end portion on the +X side. The lower surface and the end surfaces on both sides of the X-axis direction of guide 23A are polished to have a high degree of flatness and are referred to as a guide surface 23Aa (refer to FIG. 5).

Opposing guide 23A, a guide 23B, which is also made of a bar shape member that extends in the Y-axis direction and has a rectangular sectional shape, is fixed on the upper surface of plate shaped member 17 on the end portion on the +X side. The upper surface and the end surfaces on both sides of the X-axis direction of guide 23B are polished to have a high degree of flatness and are referred to as a guide surface 23Ba (refer to FIG. 5).

Each of the guide surfaces provided in guide members 23A and 23B are movement reference planes when a stator $89X_1$ of an X-axis linear motor $169_1$ and a stator a stator $89X_2$ of an X-axis linear motor $169_2$ are driven in the Y-axis direction. Guide members 23A and 23B function as an X guide, Z guide, and yaw guide when driving stators $89X_1$ and $89X_2$ in the Y-axis direction.

As is shown in FIG. 3, one of the wafer stages, wafer stage WST1 comprises: a table support body $58_1$ made up of a hollow member that has a rectangular frame shape in a YZ section; and a wafer table TB1 mounted on table support body $58_1$. And, on wafer table TB1, wafer W is held via a wafer holder (not shown) by vacuum chucking, electrostatic suction, or the like.

Figure 6:
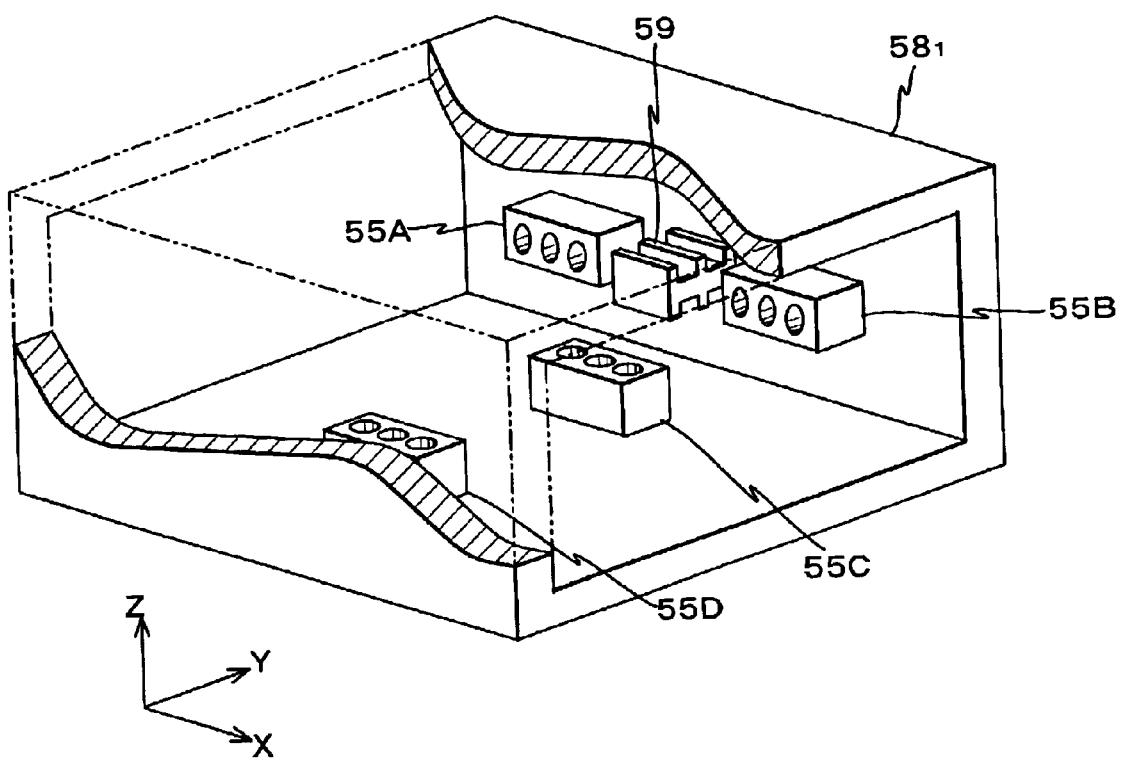
FIG. 6 is a perspective view of a table support body partly in section.

Inside table support body $58_1$, as can be seen from a partially fragmentized perspective view in FIG. 6 that shows a part of table support body $58_1$, two vacuum mechanisms 55C and 55D are arranged on the bottom surface spaced apart by a predetermined amount in the Y-axis direction. In addition, on the inner side wall surface on the +Y side of table support body $58_1$, two vacuum mechanisms 55A and 55B are fixed spaced apart by a predetermined amount in the X-axis direction, and in between the two vacuum mechanisms 55A and 55B in the center, an elastic member 59 is arranged, with its end surface on the +Y side joined to the inner surface of table support body $58_1$.

As elastic member 59, a flat spring or the like may be used, however, in the embodiment, a flexure is used. Therefore, in the following description, elastic member 59 will be referred to as "flexure 59". In this case, flexure 59 has the characteristics of deforming due to the action of stress in the rotational direction around the X-axis, and regaining its original state when the stress is released.

Figure 11A:
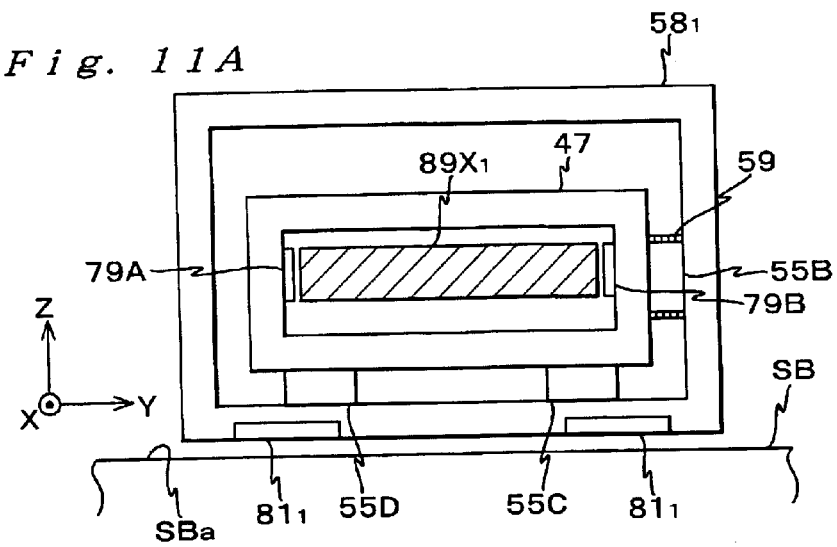
FIGS. 11A to 11C are views for describing response actions that occur when air is drawn from a first vibration isolation unit or when the first vibration isolation unit goes out of control.

As is shown in FIG. 11A, a plurality of hydrostatic gas bearings 81, that exhausts pressurized gas such as pressurized air toward stage guide surface SBa, which is the upper surface of stage base SB, are provided on the bottom surface of table support body $58_1$. With the static pressure of the pressurized gas exhausted from the plurality of hydrostatic gas bearings 811, the entire wafer stage WST1 including table support body $58_1$ is supported by levitation above stage guide surface SBa via a clearance of around several $\mu$m. The exhaustion pressure and exhaustion flow amount of hydrostatic gas bearings $81_1$ are controlled by main controller 99 (refer to FIG. 7).

In addition, as is shown in FIGS. 3 and 11A, an X-axis mover 47, which is a hollow member having a rectangular shaped YZ section, is arranged inside table support body $58_1$. And, the outer surface of the side wall of X-axis mover 47 on the +Y side is joined to the end surface of flexure 59 on the −Y side. Accordingly, X-axis mover 47 is connected with low rigidity to table support body $58_1$ via flexure 59. In addition, as is shown in FIG. 11A, in a normal state, X-axis mover 47 is connected tightly to table support body $58_1$ with high rigidity via vacuum mechanisms 55A to 55D.

In addition, inside X-axis mover 47, a magnetic polar unit (omitted in Figs.) is provided that includes N-pole permanent magnets and S-pole permanent magnets arranged alternately on the upper surface of X-axis mover 47 at a predetermined interval in the X-axis direction.

Furthermore, as is shown in FIGS. 3 and 11A, X-axis stator $89X_1$ which longitudinal direction is the X-axis direction is inserted into the space inside X-axis mover 47. A pair of hydrostatic gas bearings 79A and 79B that exhausts pressurized gas toward both end surfaces of X-axis stator $89X_1$ in the Y-axis direction are provided, on the inner surface of the side walls of X-axis mover 47 on one side and the other side in the Y-axis direction. The exhaustion pressure and exhaustion flow amount of hydrostatic gas bearings 79A and 79B toward X-axis stator $89_1$ are under the control of main controller 99 (refer to FIG. 7), and adjustment on the gap formed between X-axis mover 47 and the bearing surface of each of the hydrostatic gas bearings 79A and 79B is performed. This allows the position of X-axis mover 47 to be adjusted to a desired position in the X-axis direction with respect to X-axis stator $89X_1$.

X-axis stator $89X_1$ is made up of an armature unit that includes a plurality of armature coils arranged at a predetermined interval along the X-axis direction. X-axis stator $89X_1$ performs electromagnetic interaction between magnetic polar units (not shown) arranged on the upper surface in the inside of X-axis mover 47, which generates thrust (Lorentz force) that drives X-axis mover 47, and as a result wafer stage WST1 in the X-axis direction. That is, X-axis stator $89X_1$ and X-axis mover 47 make up a moving magnet type X-axis linear motor $169_1$ (refer to FIG. 7) that drives wafer stage WST1 in the X-axis direction.

With X-axis linear motor $169_1$ in the embodiment, a gap is secured below X-axis stator $89X_1$, which is wider compared with the gap above X-axis stator $89X_1$, as is shown in FIG. 11A.

Referring back to FIG. 3, on the upper surface of wafer table TB1, an X movable mirror $40X_1$ is provided, made of a plane mirror extending in the Y-axis direction, on one end portion (the −X side) in the X-axis direction. On one end portion (the −Y side) in the Y-axis direction, a Y movable mirror $40Y_1$ is provided, also made of a plane mirror extending in the X-axis direction. The end surfaces of wafer table TB1 may be polished, so as to form reflection surfaces (corresponding to the reflection surfaces of the above X movable mirror $40X_1$ and Y movable mirror $40Y_1$).

Wafer table TB1 is mounted on the upper surface of table support body $58_1$ via a Z tilt drive mechanism 77A (not shown in FIG. 3, refer to FIG. 7). Wafer table TB1 is structured so that it can be finely driven by Z tilt drive mechanism 77A in directions of three degrees of freedom, which is the Z-axis direction, the θx direction (rotational direction around the X-axis), and the θy direction (rotational direction around the Y-axis). Z tilt drive mechanism 77A, for example, can be arranged at positions matching the tips of a triangle on the upper surface of table support body $58_1$, and can be structured including three actuators (such as voice coil motors) that independently drive wafer table TB1 in the Z-axis direction. And, Z tilt drive mechanism 77A operates under the control of main controller 99 (refer to FIG. 7).

As is shown in FIGS. 3 and 5 and the like, a pair of sliders (Y-axis movers) $86Y_1$ and $87Y_1$ that is hollow, having a rectangular sectional shape in the XZ plane is provided, respectively, on the end portion of both one end and the other end of X-axis stator $89X_1$ in the longitudinal direction (X-axis direction). Sliders $86Y_1$ and $87Y_1$ can move along a pair of linear guides (Y-axis stators) $88Y_1$ and $88Y_2$, each of the guides having a square column shape that extends in the Y-axis direction. That is, in the embodiment, for example, linear guide $88Y_1$ and slider $86Y_1$ make up a Y-axis linear motor 186, (refer to FIG. 7), which is a moving coil type linear motor, while linear guide $88Y_2$ and slider $87Y_1$ make up a Y-axis linear motor $186_2$ (refer to FIG. 7), which is also a moving coil type linear motor.

As is shown in FIG. 3, one of the linear guides, $88Y_1$ is arranged above plate shaped member 15 making up counterweight 27 described earlier, and one end (+Y side end) of linear guide $88Y_1$ in the longitudinal direction is inserted into a frame body $108_1$ fixed close to the edge on plate shaped member 15 on the +Y side. In addition, the other end (−Y side end) of linear guide $88Y_1$ in the longitudinal direction is inserted into a frame shaped structure $13Y_1$ fixed close to the edge on plate shaped member 15 on the −Y side. On the bottom surface and both of the side surfaces inside frame body $108_1$ and frame shaped structure $13Y_1$, hydrostatic gas bearings (not shown) are provided, respectively, which exhaust pressurized gas toward Y-axis stator $88Y_1$, and by these hydrostatic gas bearings the movement of linear guide $88Y_1$ is restricted in the X-axis direction and in the Z-axis direction in a non-contact manner.

Frame shaped structure $13Y_1$ configures a stator of a trim motor $113Y_1$ (refer to FIG. 7). Frame shaped structure $13Y_1$ and linear guide $88Y_1$ (an armature unit) make up trim motor $113Y_1$ formed of a moving coil type linear motor, and trim motor $113Y_1$ can move linear guide $88Y_1$ in the Y-axis direction within a predetermined stroke range.

As is shown in FIG. 3, the other linear guide, $88Y_2$ is arranged above plate shaped member 17, and most of linear guide $88Y_2$ is covered with frame body 35. Linear guide $88Y_2$ has an arrangement similar to the above linear guide $88Y_1$, and the ends of linear guide $88Y_2$ in one direction and the other direction in the Y-axis direction above the upper surface of plate shaped member 17 are inserted, respectively, into a frame body $108_2$ (not shown in FIG. 3, refer to FIG. 4) that has a structure similar to frame body $108_1$, referred to earlier and into a frame shaped structure $13Y_2$. On the bottom surface and both of the side surfaces inside frame body $108_2$ and frame shaped structure $13Y_2$, hydrostatic gas bearings (not shown) are provided, respectively, which exhaust pressurized gas toward linear guide $88Y_2$, and with these hydrostatic gas bearings the movement of linear guide $88Y_2$ is restricted in the X-axis direction and in the Z-axis direction in a non-contact manner.

Frame shaped structure $13Y_2$ configures a stator of a trim motor $113Y_2$ (refer to FIG. 7). Frame shaped structure $13Y_2$ and linear guide $88Y_2$ (an armature unit) make up trim motor $113Y_2$ formed of a moving coil type linear motor, and trim motor $113Y_2$ can move linear guide $88Y_2$ in the Y-axis direction within a predetermined stroke range.

On the lower surface of X-axis stator $89X_1$ close to the end on the +X side, a hydrostatic gas bearing $163_1$ is provided as is shown in FIG. 5. And on the upper surface of plate shaped member 15 on the end in the −X side, corresponding to hydrostatic gas bearing $163_1$, a Z guide 21 made of a bar shaped member which has a rectangular XZ sectional shape is arranged extending in the Y-axis direction. The upper surface of Z guide 21 is processed so as to have an extremely good degree of flatness, and serves as a guide surface 21a, which is a movement reference plane when X-axis stator $89X_1$ moves in the Y-axis direction. Pressurized gas is exhausted toward guide surface 21a from hydrostatic gas bearing $163_1$, and the end on the +X side (including slider $86Y_1$) of X-axis stator $89X_1$ is supported by levitation with the static pressure of the pressurized gas.

In addition, as is shown in FIGS. 3 and 5, close to the end portion on the −X side of X-axis stator $89X_1$, recessed grooves are formed on both the upper and lower surfaces, respectively, and on each surface of these grooves, a plurality of hydrostatic gas bearings $165_1$ that exhaust pressurized gas toward guide surfaces 23Aa and 23Ba of guides 23A and 23B referred to earlier are provided. And, with these hydrostatic gas bearings $165_1$, X-axis stator $89X_1$ is supported with respect to guide surfaces 23Aa and 23Ba via a predetermined clearance, and its movement is restricted in the Z-axis direction, the X-axis direction, and the θz direction in a non-contact manner.

The other wafer stage WST2 and its drive system has a structure similar to the above wafer stage WST1, except for being symmetrical.

That is, wafer stage WST2 comprises: a table support body $58_2$ made up of a hollow member that has a rectangular frame shape in the YZ section; and a wafer table TB2 supported on table support body $58_2$ via a Z tilt drive mechanism 77B (refer to FIG. 7). These parts are arranged similar and symmetrical to wafer stage WST1 described earlier.

On the lower surface of table support body $58_2$, hydrostatic gas bearings $81_2$ (refer to FIG. 7) are provided for supporting wafer stage WST2 by levitation via a predetermined clearance between stage guide surface SBa. In addition, an X movable mirror $40X_2$ and a Y movable mirror $40Y_2$ are fixed on the upper surface of wafer table TB2, as is shown in FIG. 3. Incidentally, instead of the movable mirrors, the end surfaces of wafer table TB2 can be polished so as to form a reflection surface.

Inside table support body $58_2$, in a manner similar to table support body $58_1$ described earlier, an X-axis mover 49 is joined with low rigidity to table support body $58_2$ via a flexure, and is also connected tightly to table support body $58_2$ with high rigidity via a vacuum mechanism. And, by the electromagnetic force (Lorentz force) generated due to the electromagnetic interaction between X-axis mover 49 and X-axis stator $89X_2$, table support body $58_2$ (that is, wafer stage WST2) connected to X-axis stator 49 is driven in the X-axis direction. That is, X-axis mover 49 and X-axis stator $89X_2$ make up X-axis linear motor $169_2$ (refer to FIG. 7) of a moving coil type or the like that drives wafer stage WST2 in the X-axis direction.

On both ends of X-axis stator $89X_2$ in the longitudinal direction (X-axis direction), sliders (Y-axis movers) $86Y_2$ and $87Y_2$ are provided, and similar to the sliders previously described, sliders $86Y_2$ and $87Y_2$ can move along linear guides $88Y_1$ and $88Y_2$, respectively, in the Y-axis direction. That is, slider $86Y_2$ and linear guide $88Y_1$ make up a Y-axis linear motor $186_3$ (refer to FIG. 7), which is, for example, a moving coil type linear motor, while slider $87Y_2$ and linear guide $88Y_2$ make up a Y-axis linear motor $186_4$ (refer to FIG. 7), which is also a moving coil type linear motor.

On the lower surface of X-axis stator $89X_2$ close to the end on the +X side, a hydrostatic gas bearing $163_2$ (refer to FIG. 7) is provided that exhausts gas to guide surface 21a on the upper surface of Z guide 21.

In addition, close to the end portion on the −X side of X-axis stator $89X_2$, recessed grooves are formed on both the surfaces on the upper and lower sides likewise X-axis stator $89X_1$, and on each surface of these grooves, hydrostatic gas bearings $165_2$ (refer to FIG. 7) are provided in a similar manner described earlier. And, X-axis stator $89X_2$ is supported with respect to guide surfaces 23Aa and 23Ba via a predetermined clearance, and its movement is restricted in the Z-axis direction, the X-axis direction, and the θz direction in a non-contact manner, by the static pressure of the pressurized gas exhausted from these hydrostatic gas bearings $165_2$.

As is shown in FIG. 3, a mover $115_1$ of a trim motor $113X_1$ is fixed to one of the connection members, 56A, on its upper surface near the center in the longitudinal direction. Mover $115_1$ is engaged with a stator $13X_1$ fixed on base plate BP. As trim motor $113X_1$, a linear motor based on an electromagnetic drive method is used. Trim motor $113X_1$ generates thrust that drives connection member 56A (counterweight 27) in the X-axis direction.

On the upper surface of the other connection member, 56B, movers $115_2$ and $115_3$ of two trim motors $113X_2$ and $113X_3$ are fixed along the longitudinal direction at a predetermined interval. These movers $115_2$ and $115_3$ are engaged with stators $13X_2$ and $13X_3$ fixed to base plate BP, respectively. Similar to trim motor $113X_1$, linear motors based on an electromagnetic drive method are used as trim motors $113X_2$ and $113X_3$. These trim motors $113X_2$ and $113X_3$ generate thrust that drives connection member 56B (counterweight 27) in the X-axis direction.

Accordingly, by driving trim motor $113X_1$ and at least either one of trim motors $113X_2$ or $113X_3$ simultaneously and by setting the thrust generated by both motors at the same value, counterweight 27 can be driven in the X-axis direction. Counterweight 27 can also be rotated in the θz direction by setting the thrust generated by both motors at a different value. Trim motors $113X_1$ to $113X_3$ operate under the control of main controller 99 (refer to FIG. 7).

In exposure apparatus 10 in the embodiment that is structured as is described above, while wafer stage WST1 is performing exposure operations directly under projection optical system PL, the wafer stage WST2 side performs wafer exchange and wafer alignment operations directly under alignment system ALG2. Likewise, when wafer stage WST2 is performing exposure operations directly under projection optical system PL, the wafer stage WST1 side performs wafer exchange and wafer alignment operations directly under alignment system ALG1. That is, with exposure apparatus 10 in the embodiment, wafer stages WST1 and WST2 perform operations in parallel in the manner described above, which consequently improves the throughput.

In wafer exchange, a wafer loader (not shown) unloads a wafer mounted on wafer stage WST1 (or wafer stage WST2) that has been exposed, and then loads a new wafer on the stage.

In addition, in wafer alignment operations, wafer alignment such as EGA (Enhanced Global Alignment) is performed using alignment systems ALG1 and ALG2, which details are disclosed in, for example, Japanese Patent Application Laid-open No. 61-44429 and its corresponding U.S. Pat. No. 4,780,617. As long as the national laws in designated states or elected states, to which this international application is applied, permit, the disclosures of the Japanese Patent Application Laid-open and the U.S. Patent cited above are fully incorporated herein by reference. When such alignment is completed, exposure operations based on the step-and-scan method are repeatedly performed, which are stepping operations between shots so that wafer stage WST1 (or WST2) can be moved to the acceleration starting position for exposure on each shot area, and exposure operations for transferring the pattern of reticle R onto the shot area subject to exposure by scanning exposure previously described. Incidentally, since the exposure operations performed here are similar to that of a typical scanning stepper, a detailed description is therefore omitted.

In exposure apparatus 10 in the embodiment, as is described earlier, not only is vibration that occurs due to the reaction force generated by the drive of reticle stage RST completely prevented, but also the drive of a stage, wafer stage WST1 (or WST2), is made not to have hardly any adverse effects on both wafer stages. The details on this point will be described in the following description, mainly referring to the drawing such as FIGS. 3 and 5.

Referring to FIG. 5, when wafer stage WST1 is driven by X-axis liner motor $169_1$ in, for example, a direction shown by an arrow A (the +X direction), a reaction force acting in the opposite direction (the −X direction) acts on X-axis stator $89X_1$. The reaction force causes the entire counterweight 27 to move in the opposite direction of the direction in which wafer stage WST1 is moving, that is, a direction shown by an arrow B. When counterweight 27 moves, the momentum is conserved. Therefore, the movement of counterweight 27 absorbs the reaction force. In addition, since there is no shift in the center of gravity of the system including counterweight 27 and wafer stage WST1, no offset load occurs.

In addition, when wafer stage WST1 is driven by Y-axis liner motors $186_1$ and $186_2$ in, for example, a direction shown by an arrow C in FIG. 3 (the +Y direction), a reaction force of the drive force acts on each of the linear guides $88Y_1$ and $88Y_2$, and linear guides $88Y_1$ and $88Y_2$ move in a direction shown by an arrow D in FIG. 3 (the −Y direction). In this case, linear guides $88Y_1$ and $88Y_2$ also move according to the law of conservation of momentum, therefore, the reaction force is absorbed, as well as the generation of offset load prevented.

As is described, the reaction force due to the drive of wafer stage WST1 in the X-axis direction and Y-axis direction is totally cancelled by the movement of counterweight 27 and Y-axis stators $88Y_1$ and $88Y_2$ and the generation of offset load prevented. This almost completely prevents vibration due to the reaction force when wafer stage WST1 is driven in the X-axis direction and Y-axis direction from being generated, and does not have any adverse effects on either of the stages.

When wafer stage WST1 or wafer stage WST2 is driven intermittently in the +X direction or −X direction, the position of counterweight 27 may gradually shift (including θz rotation) exceeding its permissible movement range. In the embodiment, however, before such a situation occurs, main controller 99 (refer to FIG. 7) controls trim motors $113X_1$ to $113X_3$ so that the position in the X-axis direction and posture in the rotational direction around the Z-axis of counterweight 27 is corrected as appropriate. That is, trim motors $113X_1$ to $113X_3$ are provided for such a purpose.

Likewise, main controller 99 corrects the position of linear guides $88Y_1$ and $88Y_2$ in the Y-axis direction as appropriate via trim motors $113Y_1$ and $113Y_2$, so that linear guides $88Y_1$ and $88Y_2$ can be kept from shifting in the Y-axis direction exceeding its permissible movement range.

In addition, in exposure apparatus 10 in the embodiment, the height of the part supporting counterweight 27 of base plate BP (projected portions BPa and BPb) is increased up to a point near the center of gravity of wafer stages WST1 and WST2 and by mounting counterweight 27 and linear guides $88Y_1$ and $88Y_2$ on the support, as is shown in FIG. 5. Then, the center of gravity of each portion can be brought closer together, and a position in at least the Z-axis direction (Z position) of the acting point of the thrust that drives wafer stage WST1 (or WST2) in the X-axis direction is made to coincide as much as possible with the Z position of a center of gravity Gs of wafer stage WST1 (or WST2). With this arrangement, generation of rotation moment (pitching moment) around the Y-axis passing through center of gravity Gs can be suppressed, which can keep wafer stage WST1 (WST2) from coming into contact with stage guide surface SBa on the upper surface of stage base SB.

In addition, in exposure apparatus 10 in the embodiment, when driving wafer stage WST1 (or WST2) in the X-axis direction, the Z position of the acting point of the reaction force provided to counterweight 27 to cancel the reaction force received by linear guide $89X_1$ (or $89X_2$), which is the stator of X-axis linear motor $169_1$ (or $169_2$) (refer to FIG. 7), is also made to coincide with the Z position of a center of gravity Gc of counterweight 27, as is shown in FIG. 5. In order to achieve such an arrangement, the Z position of the point of center of gravity in the entire counterweight 27 is made higher by the method previously described. With this arrangement, generation of rotation moment (pitching moment) around the Y-axis passing through center of gravity Gc of counterweight 27 can be suppressed, which can keep counterweight 27 from coming into contact with base plate BP (projected portion BPa (or projected portion BPb)), which in turn suppresses vibration occurring in counterweight 27, as well as in wafer stages WST1 and WST2.

In addition, exposure apparatus 10 is also structured so that the acting point of the reaction force acting on linear guides $88Y_1$ and $88Y_2$ generated when driving wafer stage WST1 (or WST2) in the Y-axis direction is made to coincide as much as possible with the point of center of gravity in Y-axis stators $88Y_1$ and $88Y_2$ in the Z-axis direction and the X-axis direction. Furthermore, exposure apparatus 10 is also structured so that the point of center of gravity Gc in counterweight 27 and the acting point of thrust provided to counterweight 27 by trim motors $113X_1$ to $113X_3$ coincide as much as possible in the Z-axis direction. Also, exposure apparatus 10 is structured so that the acting point of the reaction force generated by trim motors $113Y_1$ and $113Y_2$ is made to coincide as much as possible with the point of center of gravity in Y-axis stators $88Y_1$ and $88Y_2$ in the Z-axis direction and the X-axis direction.

As is described, in the embodiment, generation of rotation moment with respect to each portion is suppressed as much as possible, by making the acting points on which the forces generated during the drive of the wafer stage act coincide with the point of center of gravity in each portion.

In such a case, however, mechanical fine adjustment has to be performed on each portion with high accuracy. Such fine adjustment, however, is actually extremely difficult. Therefore, it is inevitable that rotation moment is more or less generated. In the embodiment, such points are also considered and counterweight 27 and linear guides $88Y_1$ and $88Y_2$ are all arranged on base plate BP, therefore, even when rotation moment is generated, vibration is made to travel to base plate BP so that stage base SB is not directly vibrated.

In addition, among the various causes of rotation moment being generated referred to above, the only cause of creating vibration in stage base SB that can be considered is the point that the center of gravity of wafer stages WST1 and WST2 and the acting point of the drive force of X-axis linear motors $169_1$ and $169_2$ do not coincide with one another. In the embodiment, however, stage base SB is one of the parts making up the third frame ST supported by the first vibration isolation units 16, whereas wafer stage drive system 70, which drives wafer stages WST1 and WST2, is arranged on base plate BP. In other words, the first vibration isolation units 16 are arranged in between stage base SB and wafer stage WST1 (or WST2). Therefore, for example, by accurately measuring the amount of rotation moment and adding an offset to the first vibration isolation unit 16, the center of gravity and the position of acting point can be made to coincide easily, by several μm units.

Since wafer stage WST1 (or WST2) needs to be configured with cables and piping, the center of gravity and the position of acting point may be displaced, depending on the position of each of wafer stages WST1 and WST2 on stage base SB and the positional relationship between wafer stage WST1 and wafer stage WST2. Therefore, in the embodiment, a map containing information on the position of wafer stages WST1 and WST2 on stage base SB and the positional relationship between wafer stage WST1 and wafer stage WST2 is to be made, and the first vibration isolation units 16 are to be preferably corrected according to the map. In this case, when the first vibration isolation units 16 are corrected, the position of the upper surface of wafer tables TB1 and TB2 in the height direction (Z-axis direction, and θx and θy directions) changes. However, main controller 99 in FIG. 7 controls the position of wafer tables TB1 and TB2 in the height direction via Z tilt drive mechanisms 77A and 77B, based on the measurement values of the multiple focal point detection system (160a and 160b), making it possible to perform alignment on the upper surface of wafers W1 and W2 with respect to a reticle projection image plane at a high response. That is, in the embodiment, main controller 99 makes up an adjuster that adjusts the positional relationship between the movement plane and each of the wafer stages WST1 and WST2 related to the optical axis direction of projection optical system PL, based on the map containing information on the position of wafer stages WST1 and WST2 and the positional relationship between wafer stage WST1 and wafer stage WST2, the measurement results of wafer interferometers 142, 116, and 118, and the detection results of the multiple focal point detection system (160a and 160b).

FIG. 7 briefly shows an arrangement of a control system of exposure apparatus 10 in the embodiment. The control system is centered on main controller 99, which is made up of a workstation (or a microcomputer). Other than performing the various controls described so far, main controller 99 has overall control over the entire apparatus.

Following is a description of action that occurs in exposure apparatus 10 at times such as when vibration isolation units are out of control.

First of all, a response mechanism is described that functions when air from mechanical dampers such as air dampers of the second vibration isolation units 24 is let out, or when the second vibration isolation units 24 are out of control, referring to FIGS. 8A to 10B.

FIGS. 8A to 8A and 9A to 9C show the temporal flow of operations in each related portion when reticle stage base 30 is inclined, due to causes such as the second vibration isolation units 24 being out of control.

Figure 8A:
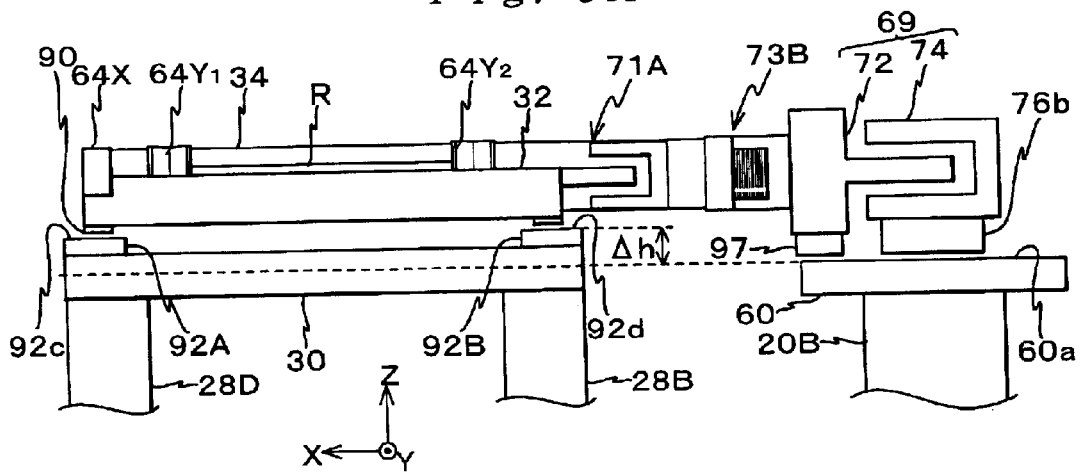
FIGS. 8A to 8C are views (first example) for describing releasing operations of a connection mechanism in a reticle stage unit.
Figure 8B:
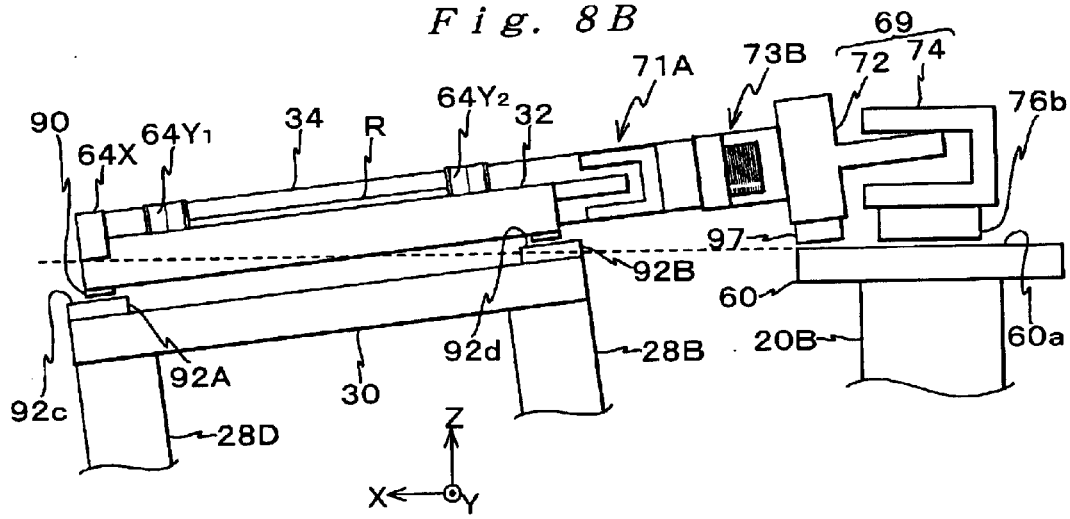
Figure 8C:
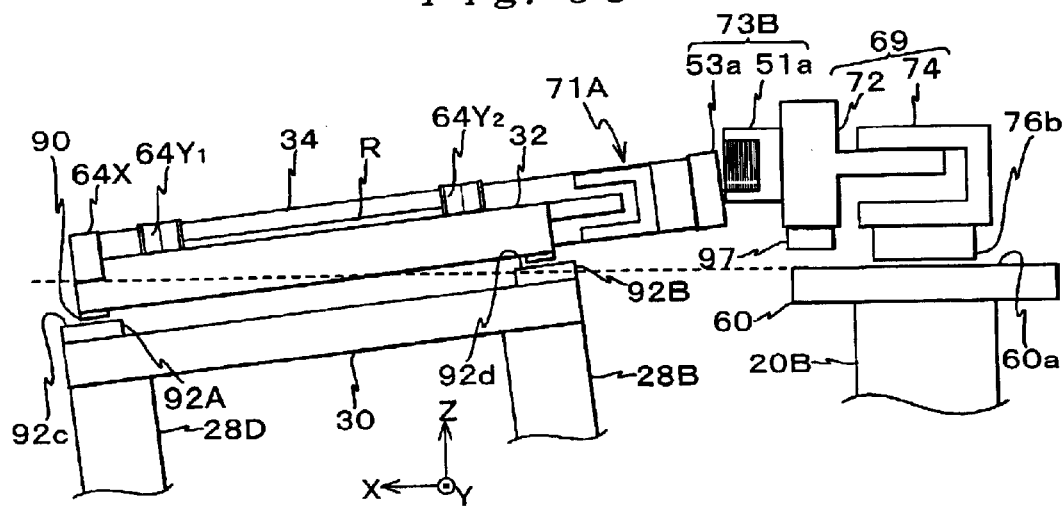
Figure 9A:
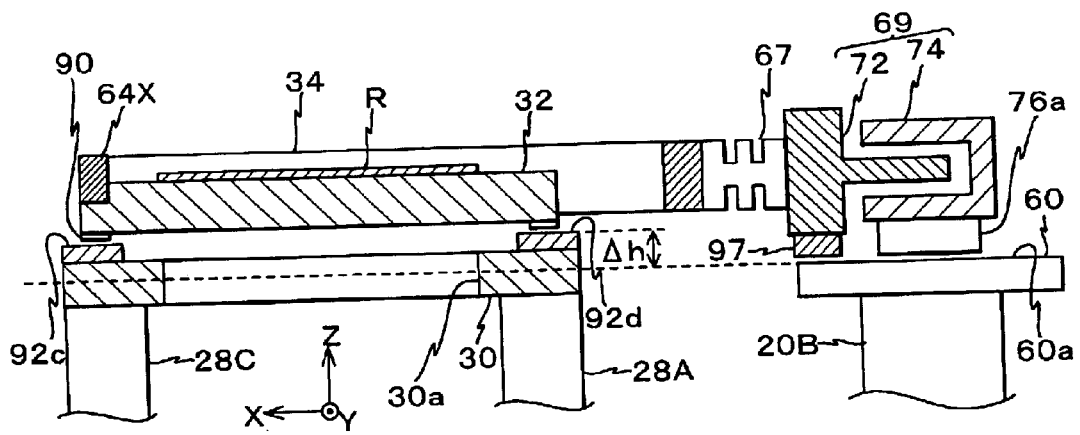
FIGS. 9A to 9C are views (second example) for describing releasing operations of a connection mechanism in a reticle stage unit.
Figure 9B:
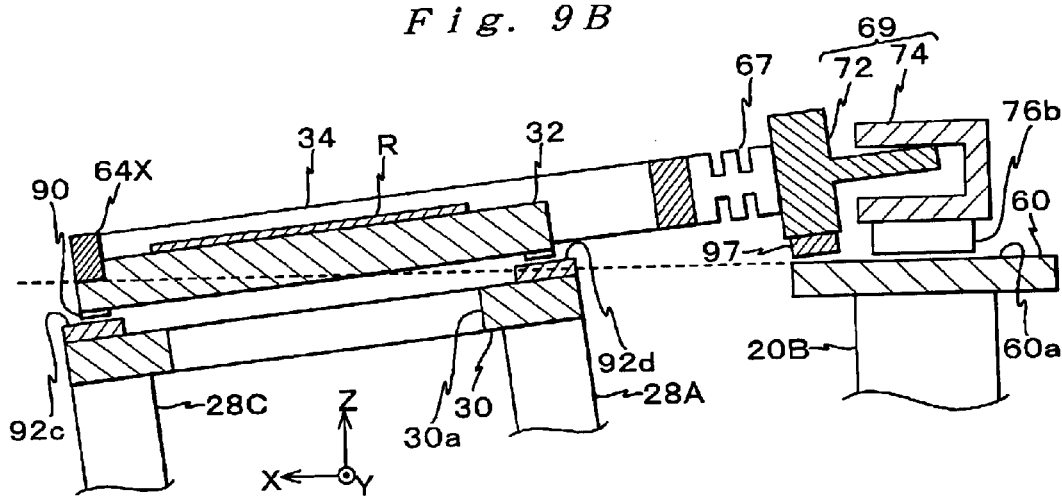
Figure 9C:
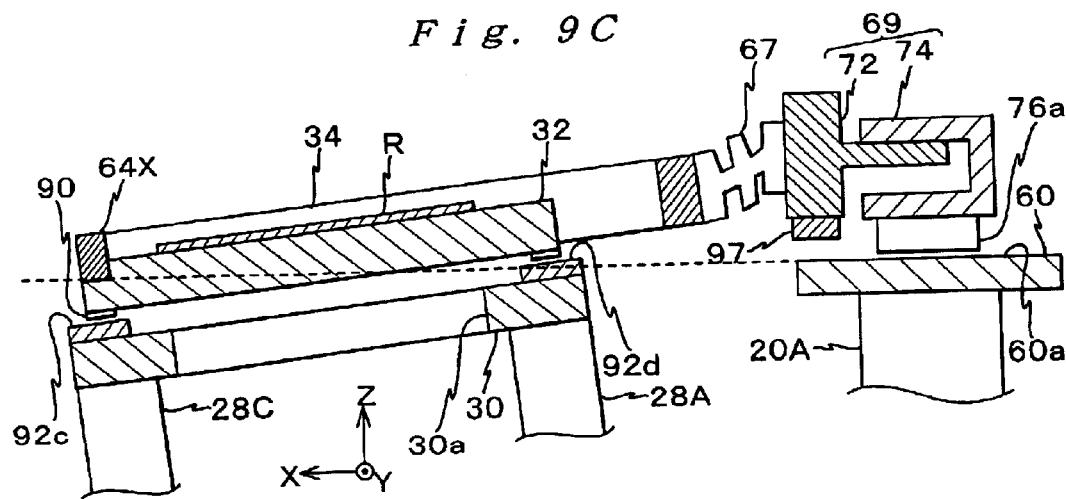

In this case, regarding connection mechanism 33, in FIGS. 8A to 8C, the mechanism is described focusing on the state of electromagnet unit 73B, while in FIGS. 9A to 9C, it is described focusing on the state of flexure 67. Incidentally, FIGS. 8A, 8B, and 8C temporally (state-wise) correspond to FIGS. 9A, 9B, and 9C, respectively.

FIGS. 8A and 9A show a normal state of the reticle stage unit. In this normal state, the relation between the first reticle guide surfaces 92c and 92d, which are the movement planes of reticle stage RST, and the second reticle guide surface 60a, which is the guide surface in the Z-axis direction of Y-axis mover 72 structuring Y-axis linear motor 69 that drives reticle stage RST in the Y-axis direction, is ideal. The state in which reticle stage base 30 and Y-axis stator support plate 60 are in an ideal positional relationship (the state where the height difference between both guide surfaces is Δh), as is shown in FIGS. 8A and 9A, will hereinafter be referred to as a "reference state".

FIGS. 8B and 9B show views of the state when the second vibration isolation units 24 are out of control. In this state, the corner of Y-axis mover 72 is in contact with the inner surface (the upper surface) of Y-axis stator 74, and further pressure on the inner surface may lead to damage of Y-axis linear motor 69, damage of the second reticle guide surface 60a due to the Y-axis mover 72 being in contact with the second reticle guide surface 60a, and damages to other portions of reticle stage system 25. Such a state is hereinafter referred to as an "abnormal state".

Figure 10A:
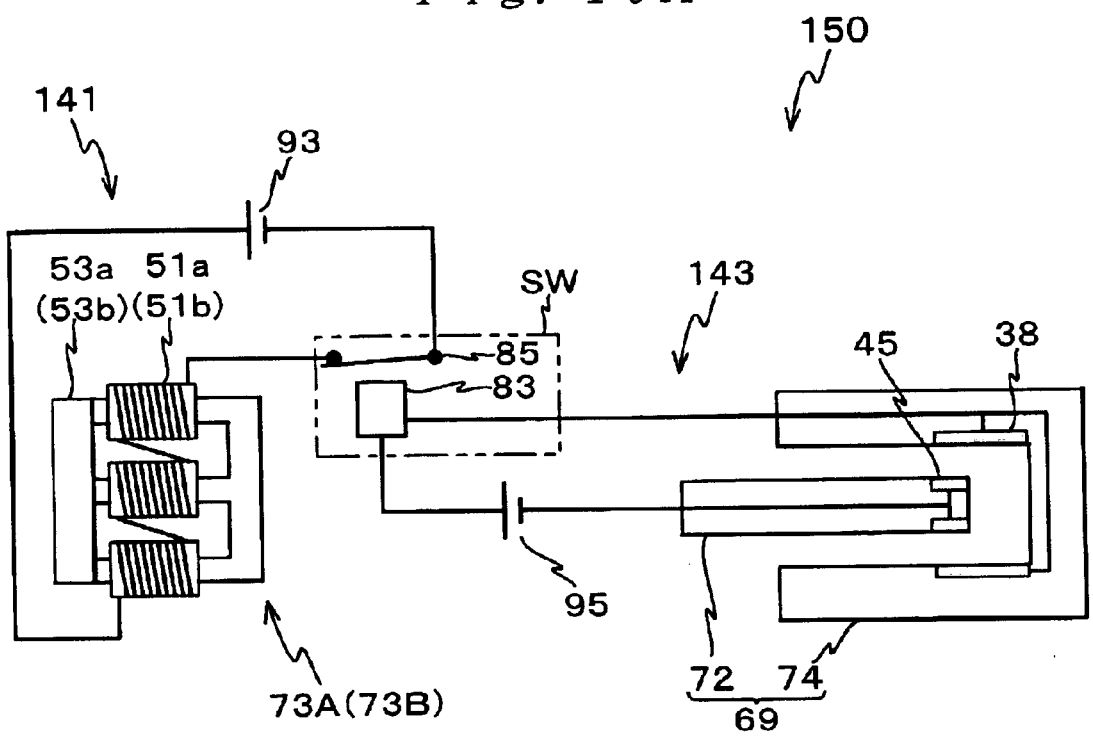
FIGS. 10A and 10B are views for describing a configuration and an operation of an on/off mechanism in a reticle stage unit.
Figure 10B:
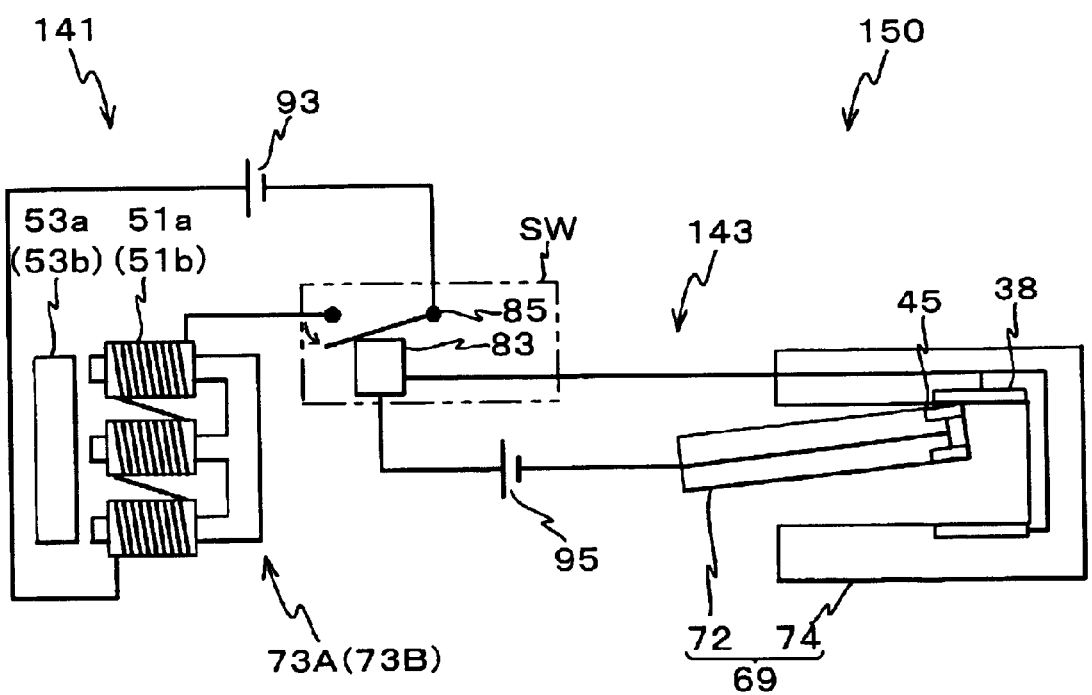

In the embodiment, when such an abnormal state occurs, the connection between electromagnet 51b and iron plate 53b of armature unit 73B and the connection between electromagnet 51a and iron plate 53a of electromagnet unit 73A are to be released immediately, as is shown in FIG. 8C, by an on/off mechanism 150 shown in FIGS. 10A and 10B, serving as a releaser.

As is shown in FIG. 10A, on/off mechanism 150 comprises a first circuit (a current supply circuit) 141 and a second circuit (switching circuit) 143. The first circuit 141 has a power supply 93 that has one end (+ end) connected to an end of a coil portion in electromagnet unit 73A (73B), while the other end (− end) is connected to the other end of the coil portion in electromagnet unit 73A (73B) via a make-and-break contact 85 of a normally closed type. Therefore, in a normal state where make-and-break contact 85 is closed as is shown in FIG. 10A, supply of current from power supply 93 to electromagnet 51a (51b) is maintained, which generates a magnetic suction force in electromagnet 51a (51b) that strongly joins electromagnet 51a (51b) and iron plate 53a (53b).

The second circuit 143 comprises: an electromagnet 83 arranged near make-and-break contact 85; a power supply 95 that has one end (+ end) connected to electromagnet 83; an electrode 45 made of metal wire or the like, being connected to the other end of power supply 95 and provided near the corner of Y-axis mover 72 (the portion assumed to come into contact first with Y-axis stator 74) making up the Y-axis linear motor 69; and an electrode 38 provided on the upper and lower surfaces inside Y-axis stator 74, being connected to electromagnet 83. And, make-and-break contact 85 and electromagnet 83 make up an electromagnetic switch SW.

In the second circuit 143, as is shown in FIG. 10A, electrodes 45 and 38 are not in contact with each other and the second circuit 143 is not a closed circuit when in the reference state (the state in FIGS. 8A and 9A). Therefore, since current is not supplied to electromagnet 83 in the second circuit 143, the closed state of make-and-break contact 85 in the first circuit 141 is maintained. That is, electromagnetic switch SW maintains an "on" state.

On the other hand, when in the abnormal state (the state in FIGS. 8B and 9B), electrodes 45 and 38 come into contact with each other, as is shown in FIG. 10B. Therefore, the second circuit 143 forms a closed circuit, making the current flow from power supply 95 into the second circuit 143, which generates a magnetic suction force that opens make-and-break contact 85 in electromagnet 83 provided in the second circuit 143. This changes the state of electromagnetic switch into an "off" state, which cuts off the current supplied from power supply 93 to electromagnet units 73A and 73B, breaking off the strong connecting force (magnetic suction force) in between iron plate 53a (53b) and electromagnet 51a (51b) and releasing the connection between iron plate 53a (53b) and electromagnet 51a (51b), or in other words, releasing the connection between reticle stage RST and Y-axis mover 72.

When the connection between reticle stage RST and Y-axis mover 72 is released in this manner, the upward force generated by hydrostatic gas bearings 97 becomes larger than the downward force acting on Y-axis mover 72, pushing up Y-axis mover 72 slightly, as is shown in FIG. 8C. However, since the upward force is extremely small, it does not go to the extent of damaging any portions of linear motor 69.

As is described, in the embodiment, when the inclination of reticle stage base 30 exceeds a predetermined amount by at least one of the second vibration isolation units 24 serving as drivers driving a part of reticle stage base 30 exceeding a predetermined amount in the Z-axis direction, such as in when the second vibration isolation units 24 go out of control, on/off mechanism 150 immediately releases the strong connection between Y-axis mover 72 and reticle stage RST, as is shown in FIG. 8C. This makes it possible to prevent damage in linear motor 69, damage on the second reticle guide surface 60a on Y-axis stator support plate 60a, or the like. In this case, since the apparatus employs a structure where on/off mechanism 150 also functions as a type of sensor, it is not necessary to arrange a specific sensor to detect whether the drive amount of reticle stage base 30 by the second vibration isolation units 24 has exceeded a predetermined value or not.

As is shown in FIG. 9C, Y-axis mover 72 and reticle coarse movement stage 34 are connected with flexure 67. Therefore, when the second vibration isolation units 24 regain their normal state and reticle stage base 30 returns to its reference position, the elastic force of flexure 67 brings Y-axis mover 72 and reticle coarse movement stage 34 back to the reference state (the state shown in FIG. 9A) without fail.

In the above description, the action that occurs when reticle stage base 30 is inclined is described, and the same action occurs even when reticle stage base simply 30 moves in the vertical direction (Z-axis direction) exceeding a predetermined value.

Next, a response mechanism is described that functions when air is let out from mechanical dampers such as air dampers of the first vibration isolation units 16, or when the first vibration isolation units 16 are out of control, focusing on one of the wafer stages WST1 and referring to FIGS. 11A to 12B.

Figure 11B:
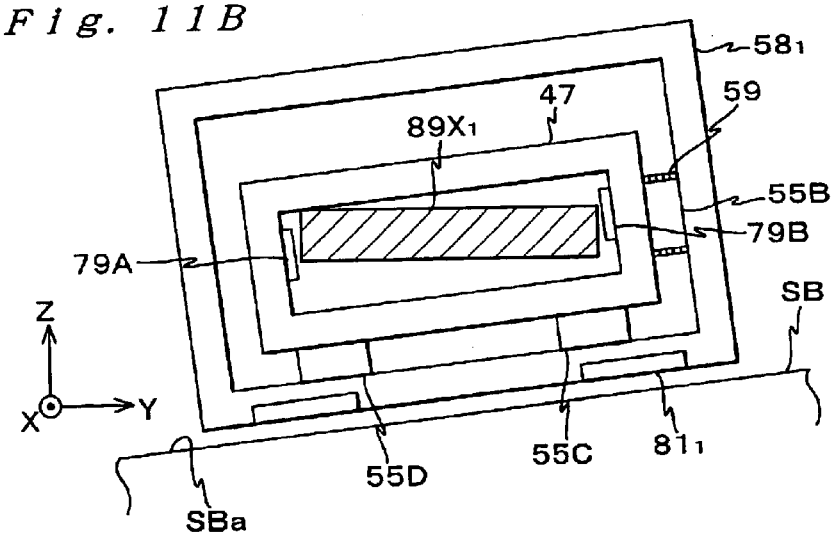
Figure 11C:
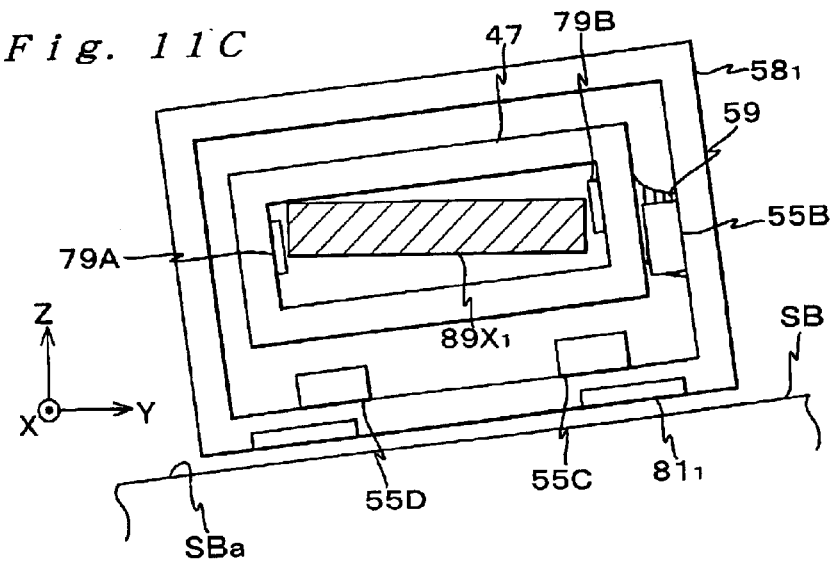

FIG. 11A is a view modeled on table support body $58_1$ and X-axis stator $89X_1$ under a normal state (a state where stage base SB is horizontal and is at an ideal height (hereinafter referred to as "reference state"). When the position of stage base SB (including inclination) changes because of the first vibration isolation unit 16 running out of control or the like, if the change is large, a part of X-axis stator $89X_1$ comes into contact with the inner surface of X-axis mover 47 inside table support body $58_1$ (hereinafter referred to as an "abnormal state"), as is shown in FIG. 11B. When such a state occurs, in order to prevent further pressure, in the embodiment, when a part of X-axis stator $89X_1$ comes into contact with table support body $58_1$ as is shown in FIG. 11B, vacuum mechanisms 55A to 55D immediately switch from a vacuumed state to an air exhaustion state. With this operation, the strong connection between X-axis mover 47 and table support body $58_1$ is released, as is shown in FIG. 11C.

On/off mechanism 150' that serves as a releaser that switches the state of vacuum mechanisms 55A to 55D from a vacuumed state to an air exhaustion state will now be described, referring to FIGS. 12A and 12B.

In on/off mechanism 150', the same principle is used as that of on/off mechanism 150, of magnetic suction force in electromagnet units 73A and 73B (refer to FIG. 2) used in connection mechanism 33 of reticle stage RST.

Figure 12A:
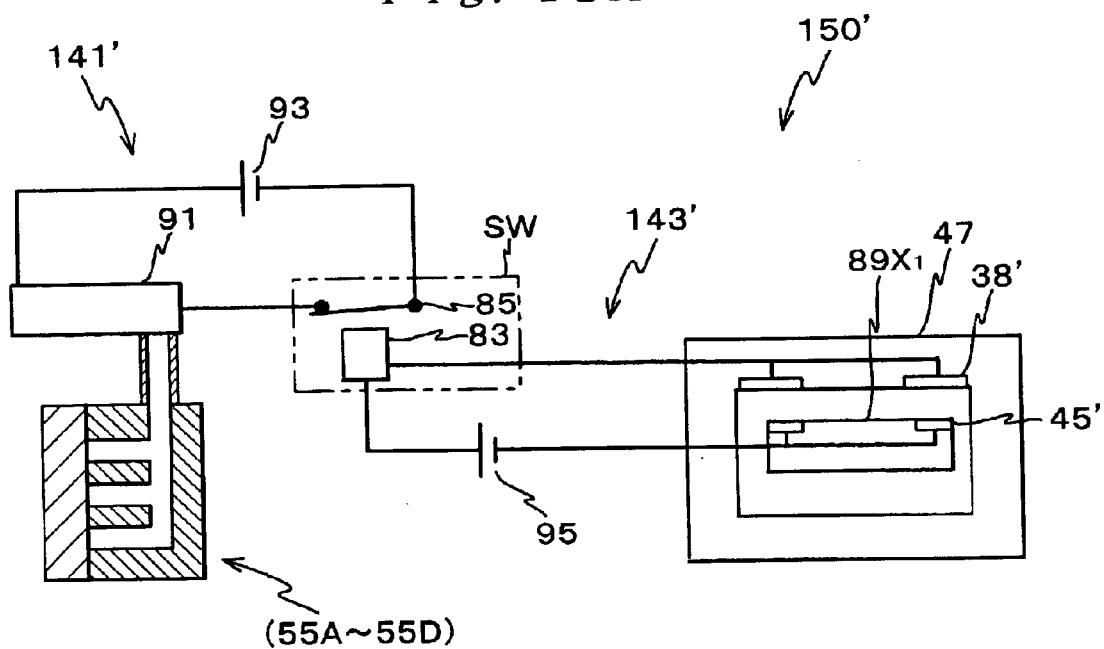
FIGS. 12A and 12B are views for describing a configuration and an operation of an on/off mechanism in a wafer stage unit.

That is, as is shown in FIG. 12A, on/off mechanism 150' comprises a first circuit (a current supply circuit) 141' and a second circuit (switching circuit) 143'. The first circuit 141' has a power supply 93 that has one end (+ end) connected to one end of an electromagnetic valve 91, while the other end (− end) is connected to the other end of an electromagnetic valve 91 via a make-and-break contact 85 of a normally closed type. Electromagnetic valve 91 functions to selectively connect a vacuum chucking path (not shown) connected to a vacuum pump (not shown) or a gas supply route (not shown) connected to a gas supply source to vacuum mechanisms 55A to 55D. That is, when current is supplied from power supply 93, which is an "on" state, electromagnetic valve 91 joins the vacuum chucking path to vacuum mechanisms 55A to 55D, whereas when current is not supplied from power supply 93, which is an "off" state, electromagnetic valve 91 joins the gas supply route to vacuum mechanisms 55A to 55D.

Therefore, in a normal state where make-and-break contact 85 is closed, as is shown in FIG. 12A, current is continuously supplied from power supply 93 to electromagnetic valve 91, which maintains the "on" state and strongly connects mover 47 to table support body $58_1$ (refer to FIG. 11A) due to the vacuum chucking force generated by vacuum mechanisms 55A to 55D.

The second circuit 143' comprises: an electromagnet 83 arranged near make-and-break contact 85; a power supply 95 that has one end (+ end) connected to electromagnet 83; an electrode 45' made of metal wire or the like, being connected to the other end of power supply 95 and provided near the corner on the upper surface of X-axis stator $89X_1$ (the portion assumed to come into contact first with mover 47) of the X-axis linear motor; and an electrode 38' provided on both ends of the upper surface inside mover 47, being connected to electromagnet 83. And, make-and-break contact 85 and electromagnet 83 make up electromagnetic switch SW.

In the second circuit 143', as is shown in FIG. 12A, electrodes 45' and 38' are not in contact with each other and the second circuit 143' is not a closed circuit when in the reference state (the state in FIG. 11A). Therefore, since current is not supplied to electromagnet 83 in the second circuit 143', the closed state of make-and-break contact 85 in the first circuit 141' is maintained. That is, electromagnetic switch SW maintains an "on" state. This allows the current to be continuously supplied to electromagnetic valve 91, thus vacuum operations can be maintained in vacuum mechanisms 55A to 55D.

Figure 12B:
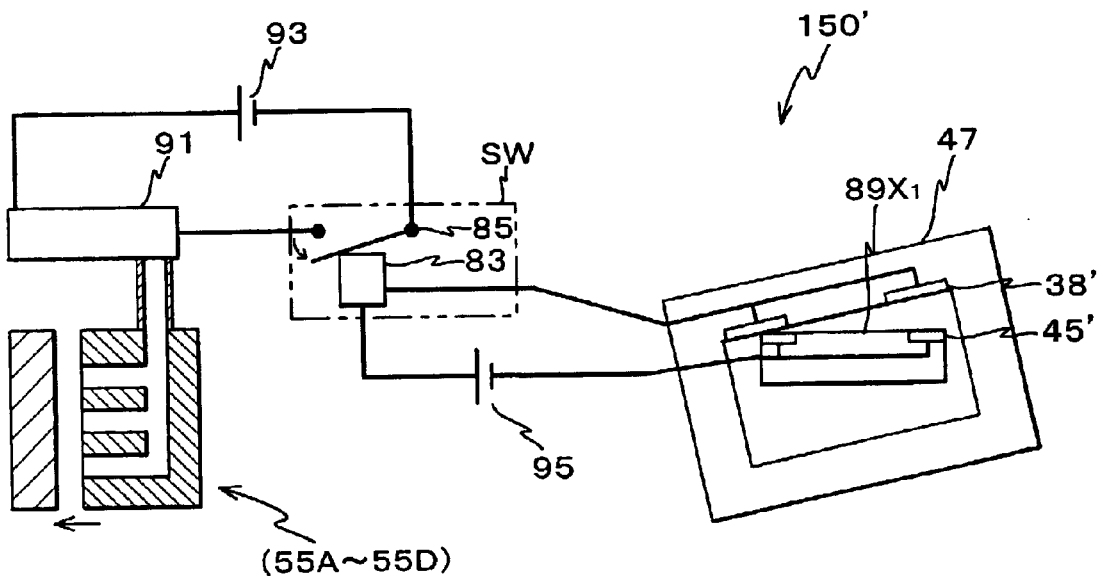

When an abnormal state (the state shown in FIG. 11B) occurs, electrodes 45' and 38' come into contact, as is shown in FIG. 12B, causing current to be supplied from power supply 95 to the second circuit 143', which generates magnetic suction force in electromagnet 83 arranged in the second circuit 143' and opens make-and-break contact 85. This operation switches electromagnetic switch SW to an "off" state, which cuts off the current supplied to electromagnetic valve 91 from power supply 93, making electromagnetic valve 91 to change the state of vacuum mechanisms 55A to 55D from a vacuumed state to an air exhaustion state (air-flowing state). With this operation, the connection between X-axis mover 47 and table support body $58_1$ by the strong connection force is released, which leaves X-axis mover 47 connected to table support body $58_1$ only with elastic member (flexure) 59 having low rigidity.

Accordingly, in the state in FIG. 11c, the force applied to X-mover 47 from X-axis stator 89X$_1$ is not very large; therefore, X-axis linear motor 169$_1$ can be kept from being damaged.

On the contrary, when electrodes 45' and 38' lose contact while the first vibration isolation units 16 are recovering to their normal state from the abnormal state, the state of vacuum mechanisms 55A to 55D switches to a vacuumed state and X-axis mover 47 and table support body 58$_1$ recover their original states (the state shown in FIG. 11A).

In addition, a similar action is taken not only when an inclination in the rotational direction around the X-axis occurs in stage base SB as is described above, but also when inclination in the rotational direction around the Y-axis occurs and when table support body 58$_1$ moves along in the Z-axis direction. In this case, since the apparatus employs a structure where on/off mechanism 150' also functions as a type of sensor, it is not necessary to arrange a specific sensor to detect whether the drive amount of stage base SB by the first vibration isolation units 16 has exceeded a predetermined value or not.

In on/off mechanism 150', when stage base SB moves upward, no recovery action can be taken even if vacuum mechanisms 55A to 55D are turned off, however, since the space in between X-axis stator 89X$_1$ and the lower surface inside X-axis mover 47 is relatively large, X-axis stator 89X$_1$ and the lower surface inside X-axis mover 47 hardly come into contact.

As a matter of course, in wafer stage WST2 side as well, damages on the guide surface or on the linear motor or the like can be prevented similarly as above without fail.

As is described so far, according to reticle stage system 25 related to the embodiment, when the drive amount of the second frame ST2 including reticle stage base 30 in the Z-axis direction by the second vibration isolation units 24 exceeds a predetermined value for some reason, on/off mechanism 150 releases the strong connection (magnetic connection) between reticle stage RST and Y-axis mover 72, leaving only the moderate connection by flexure 67. Flexure 67 allows relative displacement between Y-axis mover 72 and reticle stage RST. Accordingly, when the drive amount of retile stage base 30 by the second vibration isolation units 24 exceeds a predetermined value, on/off mechanism 150 releases the strong connection between reticle stage RST and Y-axis mover 72 before mover 72 connected to reticle stage RST come into contact with Y-axis stator 74 and both parts are put under a large stress, consequently making it possible to prevent Y-axis mover 72 and Y-axis stator 74 from being damaged.

In addition, since Y-axis stator 74 is provided independent of reticle stage base 30 vibration-wise, the position of reticle stage RST that moves along guide surfaces 92c and 92d of reticle stage base 30 can be controlled with high accuracy, without the reaction force generated in Y-axis stator 74 when driving reticle stage RST making reticle stage base 30 or the like vibrate.

Accordingly, with reticle stage system 25, reticle stage RST can be stably driven for over a long period of time.

In addition, according to wafer stage system 100 related to the embodiment, when the drive amount of stage base SB including main body column BD in the Z-axis direction by the first vibration isolation units 16 exceeds a predetermined value for some reason, on/off mechanism 150' releases the strong connection (vacuum chucking force connection) between table support body 58$_1$ of wafer stage WST1 and X-axis mover 47, leaving only the moderate connection by flexure 59. Flexure 59 allows relative displacement between X-axis mover 47 and wafer stage WST1 including table support body 58$_1$, therefore a large stress (due to the weight of wafer stage WST1 itself) can be removed from X-axis mover 47. Similarly, on wafer stage WST2 side, on/off mechanism 150' releases the strong connection between table support body 58$_2$ of wafer stage WST2 and X-axis mover 49 (vacuum chucking force connection), leaving only the moderate connection by flexure 59.

Accordingly, when the drive amount of stage base SB by the first vibration isolation units 16 exceeds a predetermined value, on/off mechanism 150' releases the strong connection between wafer stage WST1 and X-axis mover 47 before mover 47 connected to wafer stage WST1 come into contact with X-axis stator 89X$_1$ and both parts are put under a large stress, consequently making it possible to prevent X-axis mover 47 and X-axis stator 89X$_1$ from being damaged. Likewise, on/off mechanism 150' releases the strong connection between wafer stage WST2 and X-axis mover 49 before mover 49 connected to wafer stage WST2 come into contact with X-axis stator 89X$_2$ and both parts are put under a large stress, consequently making it possible to prevent X-axis mover 49 and X-axis stator 89X$_2$ from being damaged.

In addition, other than linear guides 88Y$_1$ and 88Y$_2$ serving as Y-axis stators, X-axis movers 47 and 49 are also arranged independent of stage base SB vibration-wise, therefore, the position of wafer stages WST1 and WST2 that move along guide surface SBa of stage base SB can be controlled with high accuracy, without the reaction force generated in linear guides 88Y$_1$ and 88Y$_2$ and in X-axis movers 47 and 49 when driving wafer stages WST1 and WST2 making stage base SB or the like vibrate.

Accordingly, with wafer stage system 100, wafer stages WST1 and WST2 can be stably driven for over a long period of time.

In addition, reticle stage system 25 that can drive reticle stage RST stably for over a long period is employed as the drive system for reticle R in exposure apparatus 10 in the embodiment, while wafer stage system 100 that can drive wafer stages WST1 and WST2 stably for over a long period is employed as the drive system for wafers W1 and W2. Therefore, reticle R and wafers W1 and W2 can be driven stably for over a long period, as well as good overlay accuracy be maintained between reticle R and wafer W1 and between reticle R and wafer W2. Also, in exposure apparatus 10 in the embodiment, when reticle stage base 30 or stage base SB is driven over a predetermined amount because of vibration isolation units 16 or 24 going out of control, the possibility is low of Y-axis mover 72 and Y-axis 74 on the reticle side being damaged by coming into contact, or of X-axis mover 47 and X-axis stator 89X$_1$, and X-axis mover 49 and X-axis stator 89X$_2$ on the wafer side being damaged. This allows the downtime of exposure apparatus 10 to be reduced, which as a consequence, leads to an improvement in the operation rate.

In addition, in exposure apparatus 10, as is previously described, the strong connection between stages RST, WST1, and WST2 and the movers of linear motors driving each of the stages is released by on/off mechanisms 150 and 150', without the intervention of main controller 99. Therefore, recovery action to the abnormal state such as when vibration isolation units 16 and 24 go out of control can be performed with an extremely high responsiveness.

In addition, in exposure apparatus 10, due to the various structures employed that have been described, the reaction force caused by the drive of the wafer stage(s) can be completely canceled out, which makes it possible to maintain good control accuracy even when floor rigidity is low.

Also, in exposure apparatus 10, when the strong connection between stages RST, WST1, and WST2 and the movers of linear motors driving each of the stages is released by on/off mechanisms 150 and 150', the abnormal state can smoothly return to the reference state (normal state) with good reproducibility, since a moderate connection is maintained between each of the stages and the movers via the elastic member such as the flexure. With the stage system in the present invention, however, the elastic member does not necessarily have to be provided. This is because even in such a case, the effect caused by releasing the connection would be the same.

In the above embodiment, the electromagnetic valve controls the suction operation and the airflow operation of the vacuum mechanisms, however, the present invention is not limited to this, and exposure apparatus 10 may separately have a circuit that has a mechanism to perform only vacuum-related operations and a circuit that has a mechanism to perform only airflow-related operations, and the on/off operations of each mechanisms may be alternately switched with a common switching circuit.

In the above embodiment, the case has been described where the stage system of the present invention is used for both the first drive system that drives the reticle and the second drive system that drives the wafer. The exposure apparatus in the present invention, however, is not limited to this, and it is a matter of course that only one of the stage systems may employ the stage system in the present invention.

In the above embodiment, on/off mechanism 150 using electromagnets is employed as connection mechanism 33 in reticle stage system 25, while in wafer stage system 100, on/off mechanism 150' using vacuum mechanism is employed as the on/off mechanism. The present invention, however, is not limited to this, and the stage systems may use any on/off mechanisms based on any method as the releasing unit. In addition, the connection between the stage main body and the mover may, of course, be a connection based on measures other than magnetic connection or vacuum suction force, and in such a case, a releasing unit suitable for releasing the connection may be used.

In the embodiment above, instead of the hydrostatic gas bearings provided in each portion, the structure of a combination of the so-called gimbal bearings and the hydrostatic gas bearings can be employed. In this case, the bearing surface of the hydrostatic gas bearings can be maintained in a non-contact manner via a predetermined clearance with respect to the guide surface, while the component part where gimbal bearings are connected can be maintained horizontally, which can prevent the guide surface form being damaged. In addition, by using gimbal bearings, the degree of flatness of the guide surfaces arranged in each portion does not have to be so high to drive a stage or the like with high accuracy. In this case, the rigidity of the hydrostatic gas bearings will decrease, however, it does not cause a problem since the position and posture of wafer tables TB1 and TB2 can be controlled in directions of six degrees of freedom, or in other words, in the X, Y, Z, θz, θx, and θy directions. That is, wafer tables TB1 and TB2 are controlled in directions of five degrees of freedom, in the X, Y, θz, θx, and θy directions, with high response by voice coil motors or the like that make up linear motors or Z tilt drive mechanism, based on the results from wafer interferometers 116, 118, and 142, which are all fixed to projection optical system support member 26. Furthermore, wafer tables TB1 and TB2 are controlled directly by voice coil motors or the like in the Z-axis direction, based on the output of the multiple point AF system based on an oblique incident method. Accordingly, the effect that low rigidity of the guides (hydrostatic gas bearings) has on control operations can be suppressed to the minimum.

In the embodiment above, the case has been described where the present invention is applied to a double stage type stage system that performs parallel process using two stages and an exposure apparatus comprising the system. However, the scope to which the present invention can be applied is not limited to this, and it is a matter of course that the present invention can be suitably applied to a single stage type wafer stage system and an exposure apparatus comprising the system.

In addition, in the embodiment above, the case has been described where the present invention is applied to a scanning stepper. The present invention, however, is not limited to this, and it may be applied to a static type exposure apparatus such as a stepper. Also, the usage of the exposure apparatus is not limited to only manufacturing semiconductors, but also may broadly applied to an exposure apparatus that transfers crystal display device patterns onto a glass plate, or to an exposure apparatus that manufactures a plasma display, an organic EL, a thin film magnetic head, a micromachine, or a DNA chip, or the like. And, the present invention can be applied, not only to an exposure apparatus that manufactures microdevices such as semiconductors but also to an exposure apparatus that transfers a circuit pattern onto a glass substrate or a silicon wafer for producing a reticle or a mask, which is used in an optical exposure apparatus, an EUV exposure apparatus, an X-ray exposure apparatus, an electron beam exposure apparatus, or the like.

In addition, in the exposure apparatus in the present invention, a harmonic may be used, which is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a nonlinear optical crystal. Also, the magnification of the projection optical system is not limited to a reduction system, and both a system of equal magnification or enlarged magnification may be used.

<<Device Manufacturing Method>>

An embodiment of a device manufacturing method using the above exposure apparatus in a lithographic process is described next.

Figure 13:
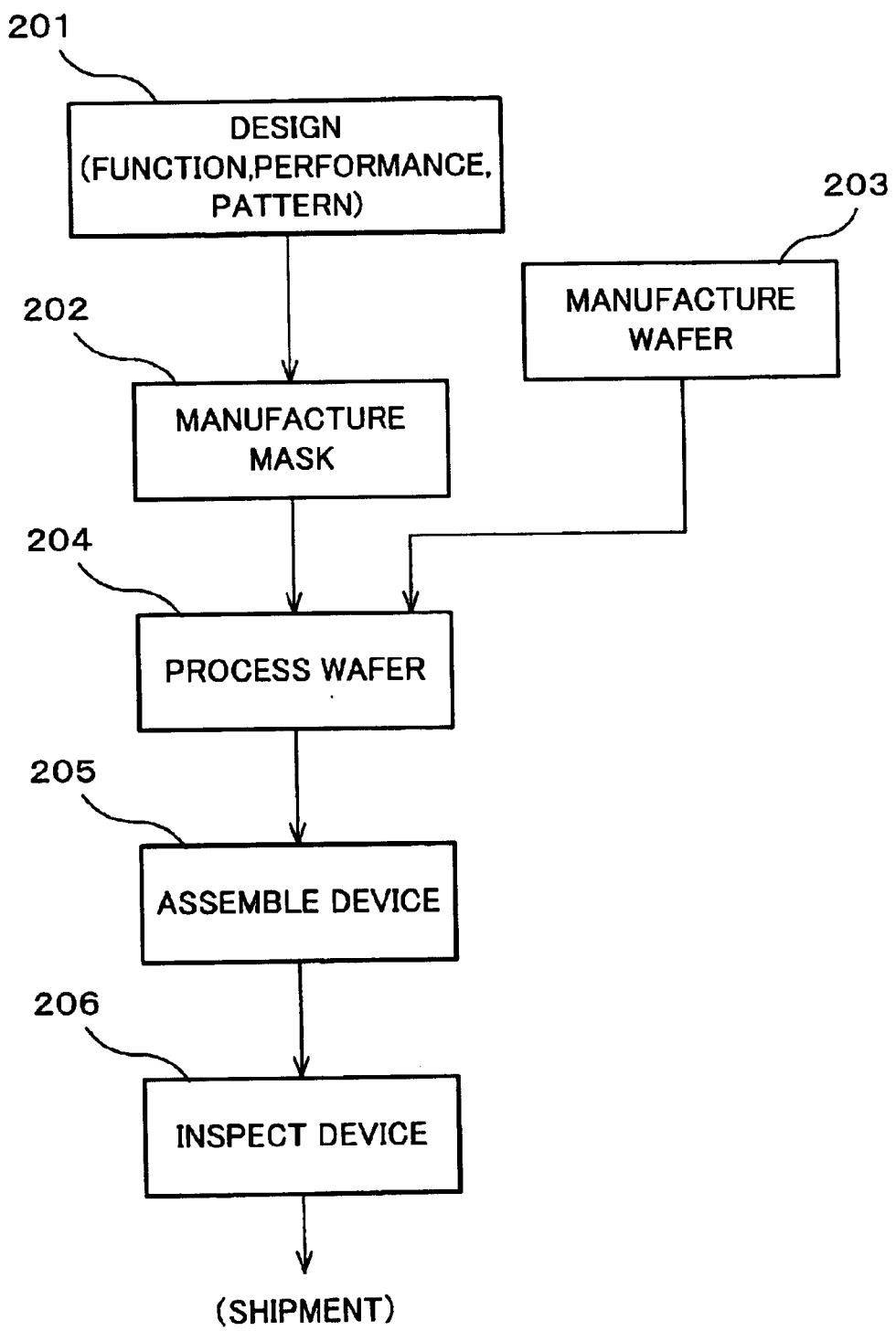
FIG. 13 is a flow chart for explaining an embodiment of a device manufacturing method according to the present invention.

FIG. 13 is a flow chart showing an example of manufacturing a device (a semiconductor chip such as an IC or LSI, a liquid crystal panel, a CCD, a thin magnetic head, a micromachine, or the like). As shown in FIG. 13, in step 201 (design step), function/performance is designed for a device (e.g., circuit design for a semiconductor device) and a pattern to implement the function is designed. In step 202 (mask manufacturing step), a mask on which the designed circuit pattern is formed is manufactured, whereas, in step 203 (wafer manufacturing step), a wafer is manufacturing by using a silicon material or the like.

In step 204 (wafer processing step), an actual circuit and the like is formed on the wafer by lithography or the like using the mask and wafer prepared in steps 201 to 203, as will be described later. Next, in step 205 (device assembly step) a device is assembled using the wafer processed in step 204. The step 205 includes processes such as dicing, bonding, and packaging (chip encapsulation), as necessary.

Finally, in step 206 (inspection step), a test on the operation of the device, durability test, and the like are performed. After these steps, the device is completed and shipped out.

Figure 14:
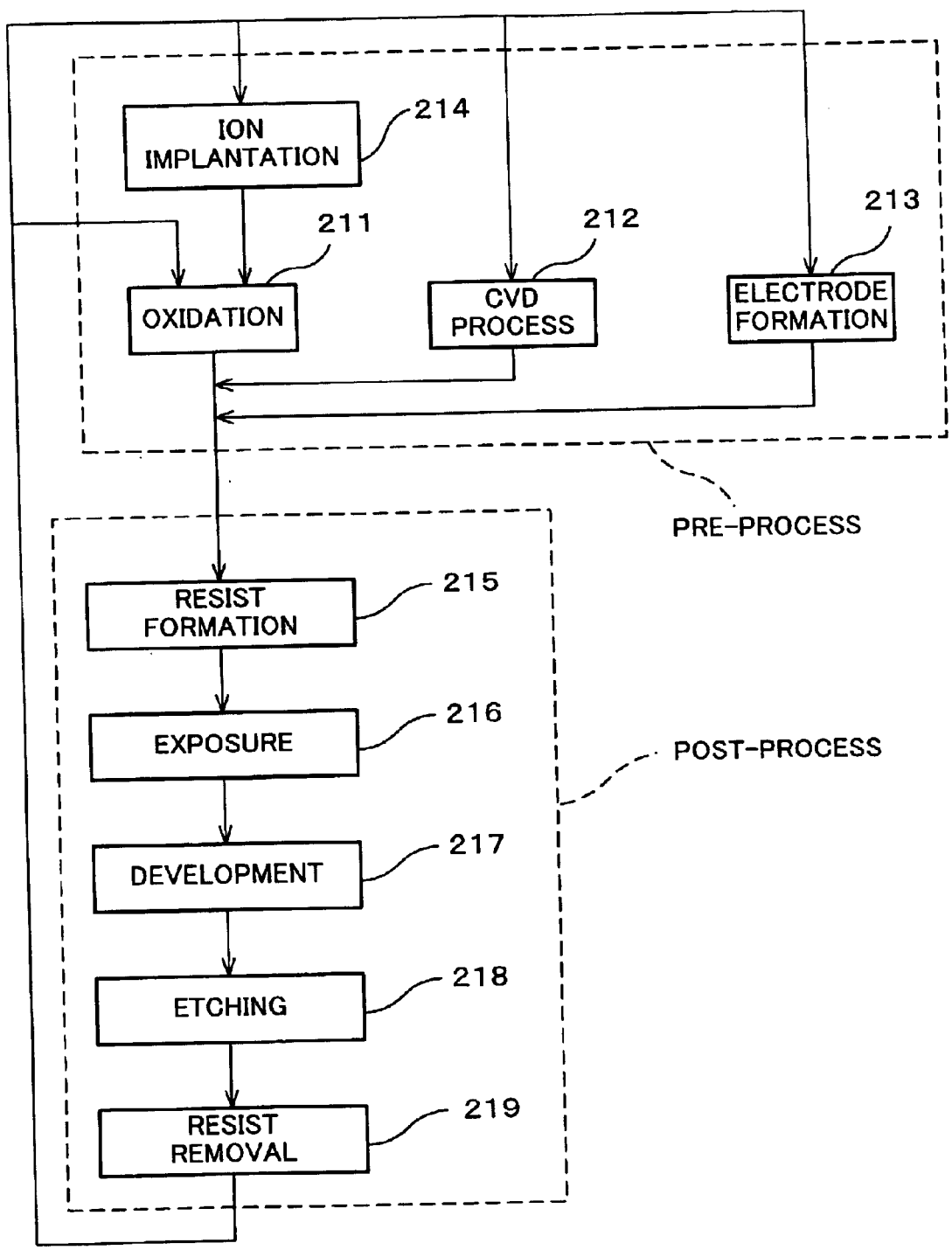
FIG. 14 is a flow chart for showing a process in step 204 in FIG. 13.

FIG. 14 is a flow chart showing a detailed example of step 204 described above in manufacturing the semiconductor device. Referring to FIG. 14, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed based on the processing required in the respective steps.

When the above pre-process is completed in the respective steps in the wafer process, a post-process is executed as follows. In this post-process, first, in step 215 (resist formation step), the wafer is coated with a photosensitive agent. Next, as in step 216, the circuit pattern on the mask is transferred onto the wafer by the lithography system (exposure apparatus) and exposure method described in the above embodiments. And, in step 217 (development step), the wafer that has been exposed is developed. Then, in step 218 (etching step), an exposed member of an area other than the area where the resist remains is removed by etching. Finally, in step 219 (resist removing step), when etching is completed, the resist that is no longer necessary is removed.

By repeatedly performing these pre-process and post-process steps, multiple circuit patterns are formed on the wafer.

When using the device manufacturing method described so far in the embodiment, since exposure apparatus 10 in the above embodiment is used in the exposure process (step 216), exposure can be performed while maintaining good overlay accuracy between the reticle and the wafer(s) for over a long period of time, as well the operation ratio improved due to reducing the downtime of the exposure apparatus. Accordingly, the productivity (including yield) of high integration microdevices that have fine patterns formed can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A stage system comprising:
   a stage main body that is movable along a movement plane of a supporting member;
   a mover that is coupled with the stage main body;
   a stator that cooperates with the mover to move the stage main body, the stator being provided independent of the supporting member regarding vibration;
   a driver that drives the supporting member; and
   a releaser that releases a coupling between the stage main body and the mover when a drive amount of the supporting member by the driver exceeds a predetermined amount.

2. The stage system of claim 1 wherein the driver drives the supporting member in a direction substantially perpendicular to the movement plane.

3. The stage system of claim 1 wherein
   the stage main body and the mover have a magnetic coupling, and
   the releaser releases the magnetic coupling.

4. The stage system of claim 1 wherein
   the stage main body and the mover have a coupling by vacuum chucking force, and
   the releaser releases the coupling by vacuum chucking force.

5. The stage system of claim 1, further comprising:
   a support mount that is provided independent of the supporting member regarding vibration, and
   the stator is coupled with the support mount.

6. The stage system of claim 1, further comprising:
   a support mount that is provided independent of the supporting member regarding vibration, and
   the stator is movably supported by the support mount.

7. The stage system of claim 6 wherein the stator that is supported movably by the support mount moves in a direction opposite to a drive direction of the stage main body due to a reaction force generated when the stage main body is driven.

8. The stage system of claim 6, further comprising:
   a position correction mechanism that corrects a positional change of the stator occurring when the stage main body moves.

9. The stage system of claim 6 wherein
   an acting point of a cooperative drive force of the stator and the mover coincides with a center of gravity of the stage main body and a center of gravity of the stator, and
   the releaser releases the coupling between the stage main body and the mover when a positional displacement between the movement plane of the supporting member and a movement plane of the stator on the support mount exceeds a predetermined value due to the driver driving the supporting member.

10. The stage system of claim 1 wherein
    the stage main body and the mover have a coupling by suction force, and
    the releaser includes an on/off mechanism that stops generating the suction force when it detects the mover coming into contact with the stator due to the driver driving the supporting member.

11. The stage system of claim 1, further comprising:
    an elastic member that has a degree of rigidity that avoids mechanical damage in the stage system when the releaser releases the coupling, and couples the stage main body and the mover.

12. An exposure apparatus that transfers a pattern formed on a mask onto a substrate, the exposure apparatus comprising:
    a first drive system that drives the mask; and
    a second drive system that drives the substrate, whereby the stage system of claim 1 is used as at least one of the first drive system and the second drive system in the exposure apparatus.

13. An exposure apparatus that exposes a photosensitive object with an energy beam and forms a predetermined pattern on the photosensitive object, the exposure apparatus comprising:
    at least one object stage movable along a first movement plane holding the photosensitive object;
    a first stage driver that has a first mover coupled with the object stage and a first stator driving the object stage by a driving force generated by physical interaction with the first mover; and a first releaser that releases a coupling between the object stage and the first mover when the first mover and the first stator come into contact due to relative displacement of the first movement plane with respect to the first stator.

14. The exposure apparatus of claim 13 wherein the object stage and the first mover have a coupling by suction force, and the first releaser releases the coupling between the object stage and the first mover by releasing the suction force.

15. The exposure apparatus of claim 14 wherein the suction force of the exposure apparatus is one of a vacuum chucking force and a magnetic suction force.

16. The exposure apparatus of claim 13 wherein the first movement plane is formed on a supporting member that is isolated from the first stator regarding vibration.

17. The exposure apparatus of claim 13 wherein a plurality of object stages are provided, and the first stage driver having a plurality of first movers individually coupled by suction force with each of the object stages, and at least one of the first stator that generates the driving force driving each of the object stages by physical interaction with each of the first movers, and the first releaser releases the suction force between at least a specific first mover and its corresponding object stage when the specific first mover comes into contact with its corresponding first stator.

18. The exposure apparatus of claim 17 wherein the suction force of the exposure apparatus is one of a vacuum chucking force and a magnetic suction force.

19. The exposure apparatus of claim 17, further comprising:

a projection optical system that projects the energy beam emitted from a mask, which is an original plate of the pattern, on the photosensitive object;

a focus detection system that detects a position of the photosensitive object held on each of the object stages in a direction of an optical axis of the projection optical system;

a position measurer that measures a position of each of the object stages within a plane perpendicular to the optical axis; and an adjuster that adjusts a positional relationship between the movement plane and each of the object stages in the direction of the optical axis, based on a map regarding a position of each of the stages and a positional relationship between at least two of the object stages, measurement results of the position measurer, and detection results of the focus detection system.

20. The exposure apparatus of claim 13, further comprising:

a mask stage that is movable along a second movement plane holding a mask, which is an original plate of the pattern;

a second stage driver that has a second mover coupled with the mask stage and a second stator driving the mask stage by a driving force generated by physical interaction with the second mover; and a second releaser that releases a coupling between the mask stage and the second mover when the second mover and the second stator come into contact due to relative displacement of the second movement plane with respect to the second stator.

21. The exposure apparatus of claim 20 wherein the mask stage and the second mover have a coupling by suction force, and the second releaser releases the coupling between the mask stage and the second mover by releasing the suction force.

22. The exposure apparatus of claim 21 wherein the suction force of the exposure apparatus is one of a vacuum chucking force and a magnetic suction force.

23. The exposure apparatus of claim 20 wherein the second movement plane is formed on a supporting member that is isolated from the second stator regarding vibration.

24. A device manufacturing method including a lithographic process, wherein in the lithographic process exposure is performed using the exposure apparatus of claim 13.

* * * * *